US012796552B2

(12) United States Patent
Ahn et al.

(10) Patent No.: US 12,796,552 B2
(45) Date of Patent: Nov. 10, 2026

(54) SEMICONDUCTOR PACKAGES AND METHODS OF MANUFACTURING THE SAME

(71) Applicant: SAMSUNG ELECTRONICS CO., LTD., Suwon-si (KR)

(72) Inventors: Seokgeun Ahn, Suwon-si (KR); Daewoo Kim, Suwon-si (KR); Seokhyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 386 days.

(21) Appl. No.: 18/356,682

(22) Filed: Jul. 21, 2023

(65) Prior Publication Data

US 2024/0136341 A1 Apr. 25, 2024

(30) Foreign Application Priority Data

Oct. 12, 2022 (KR) ........................ 10-2022-0130594

(51) Int. Cl.

| | |
|---|---|
| ***H10W 90/00*** | (2026.01) |
| ***H10W 20/20*** | (2026.01) |
| ***H10W 70/60*** | (2026.01) |
| ***H10W 70/685*** | (2026.01) |
| ***H10W 74/10*** | (2026.01) |

(52) U.S. Cl.

CPC ........... *H10W 90/00* (2026.01); *H10W 20/20* (2026.01); *H10W 70/611* (2026.01); *H10W 70/685* (2026.01); *H10W 74/117* (2026.01); *H10W 90/794* (2026.01)

(58) Field of Classification Search

CPC ... H10W 90/00; H10W 20/20; H10W 70/611; H10W 70/685; H10W 74/117; H10W 90/794; H10P 72/7412; H10P 72/7418; H10P 72/7424; H10P 72/743; H10P 72/7434; H10P 72/74

See application file for complete search history.

(56) References Cited

U.S. PATENT DOCUMENTS

| | | | |
|---|---|---|---|
| 8,263,439 | B2 | 9/2012 | Marimuthu et al. |
| 10,043,772 | B2 | 8/2018 | Lee et al. |
| 10,804,187 | B2 | 10/2020 | Lin |

(Continued)

*Primary Examiner* — Marlon T Fletcher

*Assistant Examiner* — Christina A Sylvia

(74) *Attorney, Agent, or Firm* — Wolf, Greenfield & Sacks, P.C.

(57) ABSTRACT

A semiconductor package, comprising: a first redistribution wiring layer including first and second surfaces opposite to each other, wherein the first redistribution wiring layer includes a first chip mounting region and a second chip mounting region adjacent to the first chip mounting region; a connection layer on the first surface of the first redistribution wiring layer; a first semiconductor chip on the first chip mounting region on the connection layer; a second semiconductor chip spaced apart from the first semiconductor chip on the second chip mounting region on the connection layer, wherein the second semiconductor chip includes through electrodes; a molding member on the first and second semiconductor chips on the connection layer; and a second redistribution wiring layer on the molding member, wherein the second redistribution wiring layer is electrically connected to the first redistribution wiring layer through the through electrodes.

11 Claims, 25 Drawing Sheets

(56) References Cited

U.S. PATENT DOCUMENTS

| | | | | |
|---|---|---|---|---|
| 11,127,699 | B2 | 9/2021 | Lin et al. | |
| 11,217,563 | B2 | 1/2022 | Zhai | |
| 11,239,217 | B2 | 2/2022 | Shih | |
| 11,309,283 | B2 | 4/2022 | Chang Chien et al. | |
| 11,322,477 | B2 | 5/2022 | Chen et al. | |
| 2013/0001795 | A1 | 1/2013 | Lim et al. | |
| 2015/0155203 | A1* | 6/2015 | Chen | H01L 23/5389 438/107 |
| 2018/0102311 | A1* | 4/2018 | Shih | H01L 23/5383 |
| 2021/0358875 | A1 | 11/2021 | Lee et al. | |
| 2022/0037281 | A1 | 2/2022 | Elsherbini et al. | |

* cited by examiner

SEMICONDUCTOR PACKAGES AND METHODS OF MANUFACTURING THE SAME

PRIORITY STATEMENT

This application claims priority under 35 U.S.C. § 119 to Korean Patent Application No. 10-2022-0130594, filed on Oct. 12, 2022 in the Korean Intellectual Property Office (KIPO), the contents of which are herein incorporated by reference in their entirety.

BACKGROUND

Example embodiments relate to semiconductor packages and methods of manufacturing the same. More particularly, example embodiments relate to semiconductor packages including a plurality of stacked different semiconductor chips and methods of manufacturing the same.

In heterogeneous integration (HI) technology, a high level of integration may be required in a single semiconductor package. In the semiconductor package, through silicon vias (TSVs) may be used to electrically connect different semiconductor chips, and the through silicon via is provided in a keep out zone (KOZ) of the semiconductor substrate. Because the keep out zone reduces a space utilization of the semiconductor package, the keep out zone may cause design and space limitations, and a yield loss of the semiconductor packages.

SUMMARY

Example embodiments provide a semiconductor package including a redistribution wiring layer having a structure that increases space utilization by arranging semiconductor chips in a keep out zone.

Example embodiments provide a method of manufacturing the semiconductor package.

According to example embodiments, a semiconductor package includes a first redistribution wiring layer having first and second surfaces opposite to each other, the first redistribution wiring layer having a first chip mounting region and a second chip mounting region adjacent to the first chip mounting region, the first redistribution wiring layer having a plurality of redistribution pads that are exposed from the first surface, a connection layer on the first surface of the first redistribution wiring layer, the connection layer including first connection pad structures and second connection pad structures, the first connection pad structures contacting at least one of the plurality of redistribution pads on the first chip mounting region, the second connection pad structures contacting at least one of the plurality of redistribution pads on the second chip mounting region, a first semiconductor chip on the first chip mounting region on the connection layer, the first semiconductor chip having first chip pads electrically connected to the first connection pad structures, a second semiconductor chip spaced apart from the first semiconductor chip on the second chip mounting region of the connection layer, the second semiconductor chip having through electrodes that are electrically connected to the second connection pad structures, a molding member on the first and second semiconductor chips on the connection layer, and a second redistribution wiring layer on the molding member, the second redistribution wiring layer electrically connected to the first redistribution wiring layer through the through electrodes.

According to example embodiments, in a method of manufacturing a semiconductor package, a semiconductor wafer including a first semiconductor layer is formed, the first semiconductor layer having first and second surfaces opposite to each other, the first semiconductor layer having upper pad patterns that penetrate the first semiconductor layer to be exposed from the first and second surfaces. A first semiconductor chip is on the semiconductor wafer such that chip pads of the first semiconductor chip face the first surface of the first semiconductor layer. A second semiconductor chip is on the first surface of the first semiconductor layer. The second semiconductor chip having through electrodes therethrough. A molding member is formed on the first and second semiconductor chips on the first semiconductor layer. An upper redistribution wiring layer is formed on the molding member to be electrically connected to the through electrodes. A second semiconductor layer is formed on the second surface of the first semiconductor layer, the second semiconductor layer having lower pad patterns that contact the upper pad patterns. A lower redistribution wiring layer is formed on the second semiconductor layer, the lower redistribution wiring layer electrically connected to the lower pad patterns.

According to example embodiments, a semiconductor package includes a lower redistribution wiring layer having first and second surfaces opposite to each other, the lower redistribution wiring layer having a first chip mounting region and a second chip mounting region that is adjacent to the first chip mounting region, the lower redistribution wiring layer including a plurality of first redistribution pads that are exposed from the first surface, a plurality of second redistribution pads that are exposed from the second surface, and conductive connection members on the plurality of second redistribution pads, a connection layer on the first surface of the lower redistribution wiring layer, the connection layer including first connection pad structures and second connection pad structures, the first connection pad structures contacting at least one of the plurality of first redistribution pads on the first chip mounting region, the second connection pad structures contacting at least one of the plurality of first redistribution pads on the second chip mounting region, a first semiconductor chip on the first chip mounting region of the connection layer and electrically connected to the first connection pad structures, a second semiconductor chip on the second chip mounting region of the connection layer to be spaced apart from the first semiconductor chip, the second semiconductor chip having a plurality of through electrodes that is electrically connected to the second connection pad structures, a molding member on the first and second semiconductor chips on the connection layer, and an upper redistribution wiring layer on the molding member and electrically connected to the lower redistribution wiring layer through the plurality of through electrodes.

According to example embodiments, a semiconductor package may include a first redistribution wiring layer having first and second surfaces opposite to each other, the first redistribution wiring layer having a first chip mounting region and a second chip mounting region adjacent to the first chip mounting region, the first redistribution wiring layer having a plurality of redistribution pads that are exposed from the first surface, a connection layer on the first surface of the first redistribution wiring layer, the connection layer including first connection pad structures and second connection pad structures, the first connection pad structures contacting at least one of the plurality of redistribution pads on the first chip mounting region, the second connection pad structures contacting at least one of the plurality of redistribution pads on the second chip mounting region, a first semiconductor chip on the first chip mounting region of the connection layer, the first semiconductor chip having first chip pads electrically connected to the first connection pad structures, a second semiconductor chip spaced apart from the first semiconductor chip on the second chip mounting region of the connection layer, the second semiconductor chip having through electrodes that are electrically connected to the second connection pad structures, a molding member on the first and second semiconductor chips on the connection layer, and a second redistribution wiring layer on the molding member, the second redistribution wiring layer electrically connected to the first redistribution wiring layer through the through electrodes.

Thus, the first and second redistribution wiring layers may be electrically connected to each other through the through electrodes (through silicon vias) of the second semiconductor chip. The first and second semiconductor chips may be electrically connected to each other through the first redistribution wiring layer. Since the second semiconductor chip has the through electrodes, the semiconductor package may utilize a keep out zone (KOZ) that provides the through silicon vias through the second semiconductor chip. The second semiconductor chip may include a memory semiconductor or a logic semiconductor. Restrictions on design and limited space of the semiconductor package may be solved through the through silicon vias of the second semiconductor chip.

Also, the first and second semiconductor chips may be spaced apart from each other on the first redistribution wiring layer, and the molding member may be filled between the first and second semiconductor chips. The molding member may prevent thermal coupling between the first and second semiconductor chips. The connection layer provided on the first redistribution wiring layer may strongly fix the first and second semiconductor chips during a process of covering the first and second semiconductor chips with the molding member on the first redistribution wiring layer. Since oxide bonding is formed between the first and second semiconductor chips and the connection layer, the first and second semiconductor chips may be strongly fixed to the connection layer. The connection layer may prevent a chip alignment change of the first and second semiconductor chips during the process. The connection layer may support the semiconductor package from the inside of the semiconductor package, and may prevent warpage of the semiconductor package.

BRIEF DESCRIPTION OF THE DRAWINGS

Example embodiments will be more clearly understood from the following detailed description taken in conjunction with the accompanying drawings.

FIG. 1 is a plan view illustrating a semiconductor package in accordance with example embodiments.

FIG. 2 is a cross-sectional view taken along the line A-A' in FIG. 1.

FIG. 3 is an enlarged cross-sectional view illustrating portion 'B' in FIG. 2.

FIG. 4 is a plan view illustrating first and second semiconductor chips that are exposed from an upper surface of a molding member in accordance with example embodiments.

FIGS. 5 to 25 are views illustrating a method of manufacturing a semiconductor package in accordance with example embodiments.

DETAILED DESCRIPTION OF EXAMPLE EMBODIMENTS

Hereinafter, example embodiments will be explained in detail with reference to the accompanying drawings.

Figure 1:
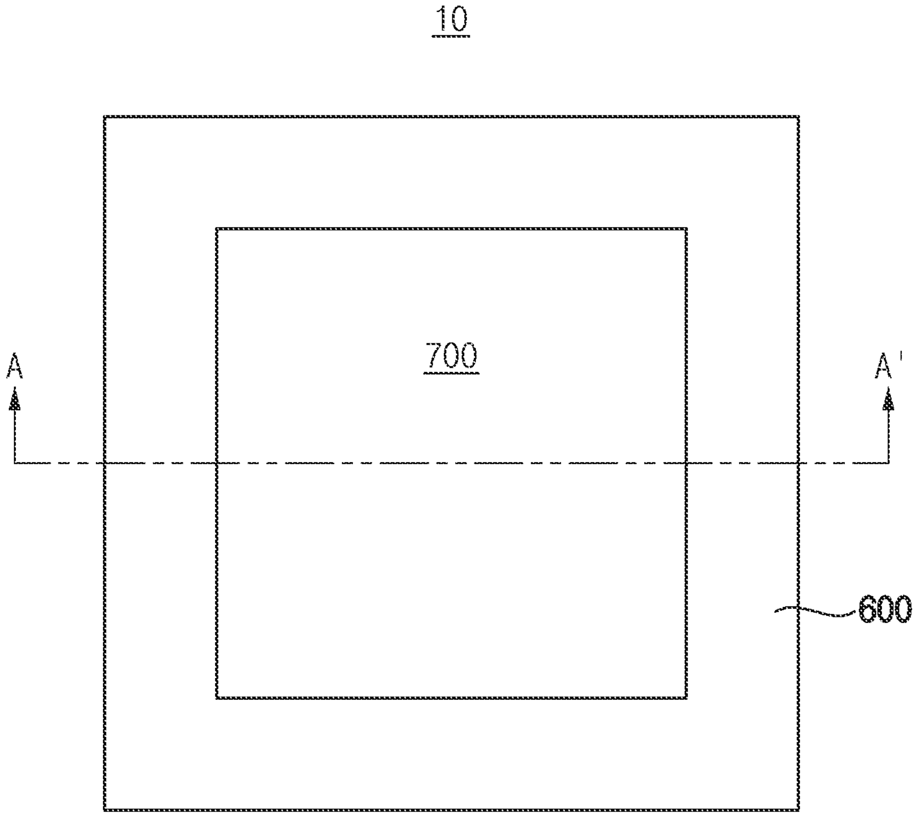
FIGS. 1 to 25 represent non-limiting, example embodiments as described herein.
Figure 2:
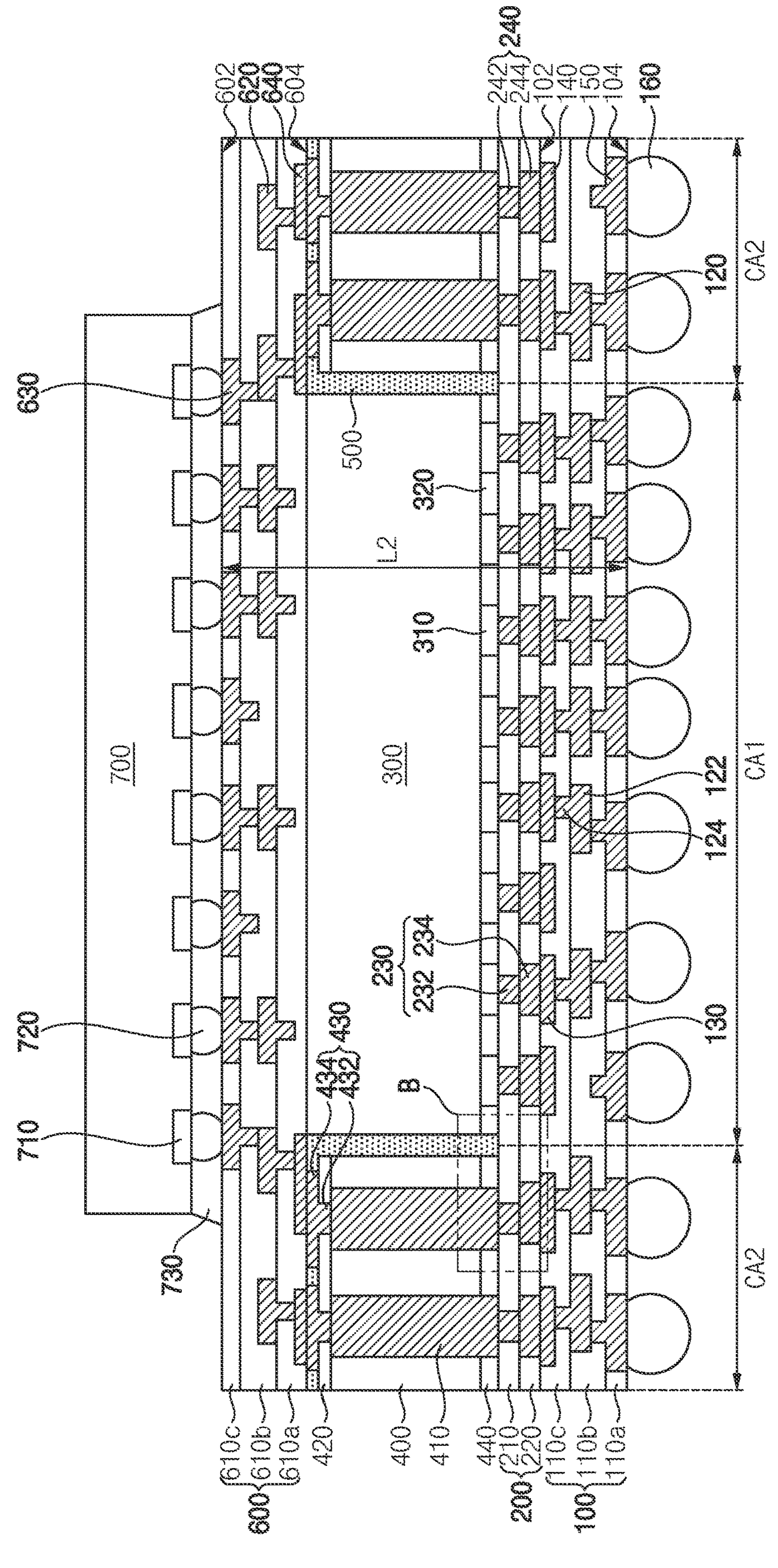
Figure 3:
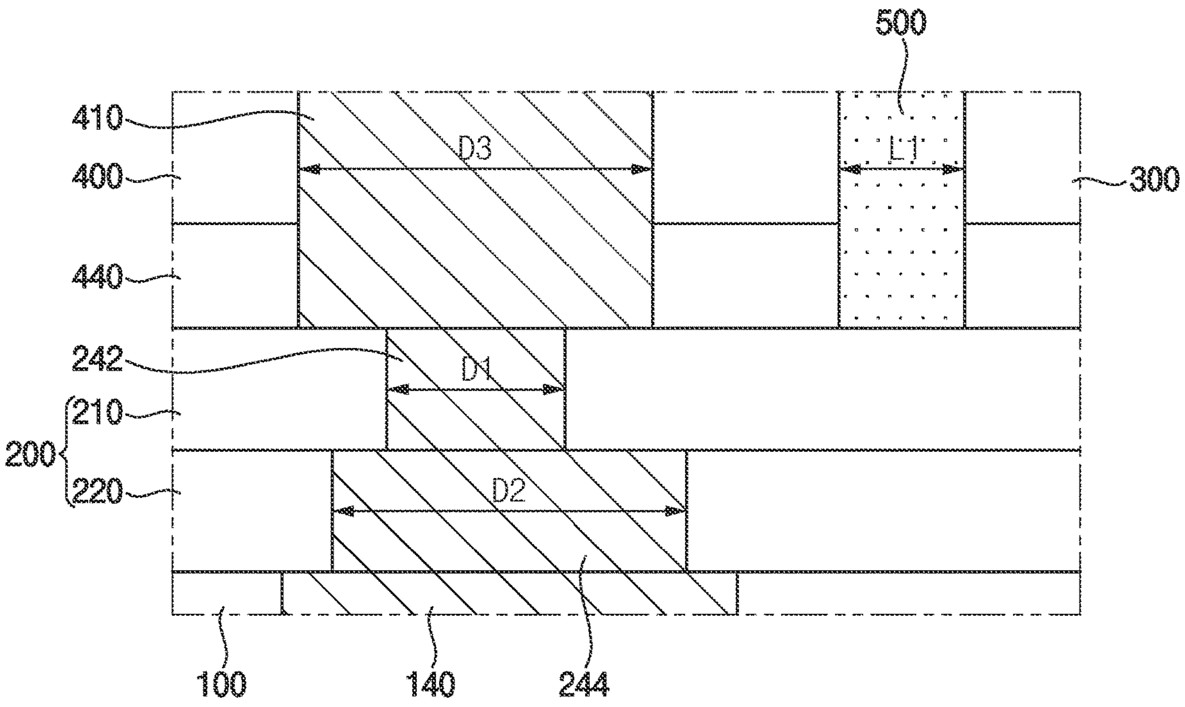
Figure 4:
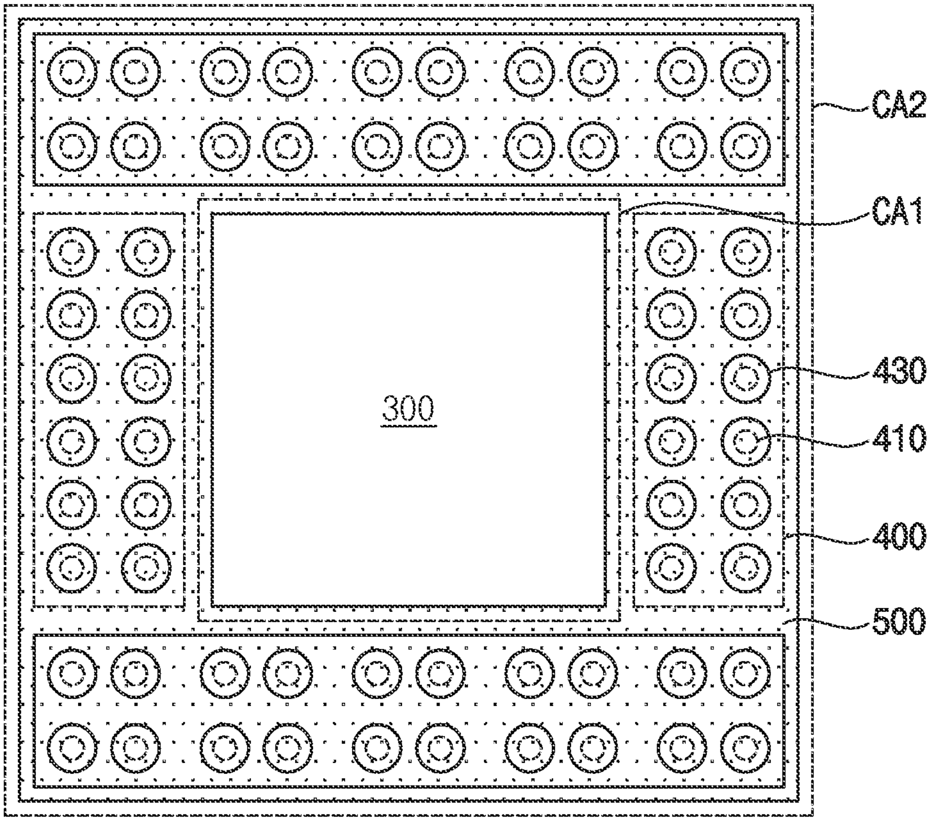

FIG. 1 is a plan view illustrating a semiconductor package in accordance with example embodiments. FIG. 2 is a cross-sectional view taken along the line A-A' in FIG. 1. FIG. 3 is an enlarged cross-sectional view illustrating portion 'B' in FIG. 2. FIG. 4 is a plan view illustrating first and second semiconductor chips that are exposed from an upper surface of a molding member in accordance with example embodiments.

Referring to FIGS. 1 to 4, a semiconductor package 10 may include a lower redistribution wiring layer 100, a connection layer 200 that is provided on the lower redistribution wiring layer 100, at least one first semiconductor chip 300 that is mounted on the connection layer 200, at least one second semiconductor chip 400 that is mounted on the connection layer 200, a molding member 500 on (e.g., covering at least a portion of) the first and second semiconductor chips 300 and 400 on the connection layer 200, and an upper redistribution wiring layer 600 arranged on the molding member 500. The semiconductor package 10 may further include at least one third semiconductor chip 700 that is mounted on the upper redistribution wiring layer 600.

In example embodiments, the semiconductor package 10 may be a memory module that has a stacked chip structure in which a plurality of dies (chips) are stacked. For example, the first semiconductor chip 300 may be an ASIC serving as a host such as a CPU, GPU, or SoC. The second and third semiconductor chips 400 and 700 may include, for example, a high bandwidth memory (HBM) device, a dynamic random access memory (DRAM), and the like.

In example embodiments, the lower redistribution wiring layer (first redistribution wiring layer) 100 may include a plurality of lower redistribution wires 120. The lower redistribution wiring layer 100 may include a first surface 102 and a second surface 104 opposite to each other. The lower redistribution wiring layer 100 may include a plurality of first and second redistribution pads 130 and 140 that are provided to be exposed from an upper surface of the lower redistribution wiring layer 100, that may be, the first surface 102, and a plurality of first bonding pads 150 that are provided to be exposed from a lower surface of the lower redistribution wiring layer 100, that may be, the second surface 104 opposite to the first surface 102.

The lower redistribution wiring layer 100 may include a first chip mounting region CA1 on which the first semiconductor chip 300 is mounted, and a second chip mounting region CA2 on which the second semiconductor chip 400 is mounted. The second chip mounting region CA2 may be adjacent to and extend around (e.g., surround) the first chip mounting region CA1. The first redistribution pads 130 electrically connected to the first semiconductor chip 300 may be provided in the first chip mounting region CA1. The second redistribution pads 140 electrically connected to the second semiconductor chip 400 may be provided in the second chip mounting region CA2.

In example embodiments, the lower redistribution wiring layer 100 may include a plurality of lower insulating layers 110. The plurality of lower insulating layers 110 may include a first insulating layer 110*a*, a second insulating layer 110*b*, and/or a third insulating layer 110$c$, and the lower redistribution wires 120 provided in the plurality of lower insulating layers 110. The plurality of lower insulating layers 110 may include, for example, a polymer or a dielectric layer. The plurality of lower insulating layers 110 may be formed by, for example, a vapor deposition process, a spin coating process, or the like. The lower redistribution wires 120 may be formed by, for example, a plating process, an electroless plating process, a vapor deposition process, or the like. The lower redistribution wires 120 may electrically connect the first and second redistribution pads 130 and 140 and the first bonding pads 150.

In example embodiments, at least a portion of the plurality of lower insulating layers 110 may be on (e.g., cover) the lower redistribution wires 120. The first insulating layer 110$a$ (e.g., lowermost insulating layer among the plurality of lower insulating layers 110) may be provided on the second surface 104 of the lower redistribution wiring layer 100, and the third insulating layer 110$c$ (e.g., uppermost insulating layer among the plurality of lower insulating layers 110) may be provided on the first surface 102 of the lower redistribution wiring layer 100.

Particularly, the first and second redistribution pads 130 and 140 may be provided in the third insulating layer 110$c$. An upper surface of each of the first and second redistribution pads 130 and 140 may be exposed from an upper surface of the third insulating layer 110$c$, that may be, the first surface 102. The third insulating layer 110$c$ may have a third opening that exposes the upper surface of each of the first and second redistribution pads 130 and 140.

The first bonding pads 150 may be provided in the first insulating layer 110$a$. A lower surface of the first bonding pads 150 may be exposed from a lower surface of the first insulating layer 110$a$, that may be, the second surface 104. The first insulating layer 110$a$ may have a first opening that exposes an upper surface of the first bonding pad 150.

The lower redistribution wires 120 may be provided on the first insulating layer 110$a$, and may contact the first bonding pads 150 through the first opening. The second insulating layer 110$b$ may be provided on the first insulating layer 110$a$, and may have a second opening that exposes the lower redistribution wire 120 (e.g., an upper surface of the lower redistribution wire 120).

The first redistribution pad 130 may be provided on the second insulating layer 110$b$, and may contact the lower redistribution wire 120 through the second opening. The third insulating layer 110$c$ may be provided on the second insulating layer 110$b$, and may have a third opening that exposes the first redistribution pad 130 (e.g., an upper surface of the first redistribution pad 130). Accordingly, an upper surface of a plurality of first redistribution pads 130 may be exposed from the upper surface of the third insulating layer 110$c$, that may be, the first surface 102.

The lower redistribution wires 120 may include a redistribution via 124 provided in opening that penetrates one among the plurality of lower insulating layers 110 (e.g., third insulating layer 110$c$), and a redistribution line 122 on the redistribution via 124 and extending along an upper surface of one among the plurality of lower insulating layers 110 (e.g., upper surface of the second insulating layer 110$b$). For example, the redistribution via 124 may be provided on the redistribution line 122 toward the first surface 102 of the lower redistribution wiring layer 100. For example, the semiconductor package 10 may include a chip first structure. The chip first structure may be formed during a process of forming the semiconductor package. Particularly, first, the semiconductor chips may be temporarily fixed. Then, the redistribution layer may be formed on the fixed semiconductor chips to form the chip first structure.

The first and second redistribution pads 130 and 140, the first bonding pads 150 and the lower redistribution wires 120 may include a metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof, but is not limited thereto.

In example embodiments, the lower redistribution wiring layer 100 may be connected to (e.g., electrically connected to) external semiconductor devices through external connection bumps 160 as conductive connection members. The external connection bumps 160 may be provided on the first bonding pads 150. For example, the external connection bumps 160 may include a C4 bump. The first bonding pads 150 of the lower redistribution wiring layer 100 may be electrically connected to substrate pads of the package substrate (not illustrated in FIGS. 1-4) through the external connection bumps 160.

In example embodiments, the connection layer 200 may be provided on the first surface 102 of the lower redistribution wiring layer 100. The connection layer 200 may include first and second semiconductor layers 210 and 220 and a plurality of first and second connection pad structures 230 and 240 that penetrate the first and second semiconductor layers 210 and 220. The connection layer 200 may electrically connect the lower redistribution wiring layer 100 and the first and second semiconductor chips 300 and 400.

The first semiconductor layer 210 may be provided on the second semiconductor layer 220. The second semiconductor layer 220 may be provided on the first surface 102 of the lower redistribution wiring layer 100. For example, the first and second semiconductor layers 210 and 220 may include silicon (Si), silicon dioxide ($SiO_2$), silicon nitride (SiCN), germanium (Ge), silicon-germanium (Si—Ge), gallium phosphide (GaP), gallium arsenide (GaAs), and gallium antimonide (GaSb), but is not limited thereto. In some embodiments, each of the first and second semiconductor layers 210 and 220 may be a silicon layer.

The first connection pad structures 230 may be provided on the first chip mounting region CA1. The first connection pad structures 230 may be respectively provided on the first redistribution pads 130 of the lower redistribution wiring layer 100. The first connection pad structures 230 may contact and/or be electrically connected to the first redistribution pads 130, respectively (e.g., the first connection pad structures 230 may contact at least one of the first redistribution pads 130).

The first connection pad structure 230 may include a first upper pad pattern 232 that penetrates the first semiconductor layer 210, and a first lower pad pattern 234 that penetrates the second semiconductor layer 220. The first upper pad pattern 232 may be exposed from an upper surface and a lower surface of the first semiconductor layer 210. The first upper pad pattern 232 may be provided on the first lower pad pattern 234. The first upper pad pattern 232 may contact and/or be electrically connected to a first chip pad 310 of the first semiconductor chip 300. The first lower pad pattern 234 may contact and/or be electrically connected to the first redistribution pad 130 of the lower redistribution wiring layer 100.

For example, the first upper pad pattern 232 and the first lower pad pattern 234 may have a trapezoidal shape when viewed in cross section. The trapezoidal shape of the first upper pad pattern 232 may narrow toward the first lower pad pattern 234. The trapezoidal shape of the first lower pad pattern 234 may widen toward the first redistribution pad 130.

The first upper pad pattern 232 may have a first width D1 in a horizontal direction parallel to the first surface 102 (e.g., parallel to an upper surface of the first semiconductor layer 220). The first lower pad pattern 234 may have a second width D2 in the horizontal direction parallel to the first surface 102 (e.g., parallel to the upper surface of the first semiconductor layer 220) greater than the first width D1. Since the second width D2 of the first lower pad pattern 234 is greater than the first width D1 of the first upper pad pattern 232, the first lower pad pattern 234 may compensate an electrical signal of the first upper pad pattern 232. In some embodiments, each of the first upper pad pattern 232 and the first lower pad pattern 234 may have a round shape, and the first width D1 and the second width D2 may be respectively widest widths of the first upper pad pattern 232 and the first lower pad pattern 234 in the horizontal direction. When each of the first upper pad pattern 232 and the first lower pad pattern 234 has a circular shape, the first width D1 and the second width D2 may be respectively diameters of the first upper pad pattern 232 and the first lower pad pattern 234.

For example, the first width D1 of the first upper pad pattern 232 may be within a range of 0.1 micrometers (㎛) to 50 ㎛. The second width D2 of the first lower pad pattern 234 may be within a range of 1.1 ㎛ to 50 ㎛.

The second connection pad structures 240 may be provided on the second chip mounting region CA2. The second connection pad structures 240 may be respectively provided on the second redistribution pads 140 of the lower redistribution wiring layer 100. The second connection pad structures 240 may contact and/or be electrically connected to the second redistribution pads 140, respectively (e.g., the second connection pad structures 240 may contact at least one of the second redistribution pads 140).

The second connection pad structure 240 may include a second upper pad pattern 242 that penetrates the first semiconductor layer 210, and a second lower pad pattern 244 that penetrates the second semiconductor layer 220. The second upper pad pattern 242 may be exposed from the upper and the lower surfaces of the first semiconductor layer 210. The second upper pad pattern 242 may be provided on the second lower pad pattern 244.

The second upper pad pattern 242 may contact and/or be electrically connected to the through electrode 410 (e.g., at least one of the through electrodes 410) of the second semiconductor chip 400. The second upper pad pattern 242 may be electrically connected to the through electrode 410 of the second semiconductor chip 400, and the second upper pad pattern 242 may serve as a chip pad that electrically connects the second semiconductor chip 400 and the lower redistribution wiring layer 100.

The second lower pad pattern 244 may contact and/or be electrically connected to the second redistribution pad 140 (e.g., at least one of the plurality of redistribution pads 140) of the lower redistribution wiring layer 100. The second lower pad pattern 244 may be electrically connected to the second redistribution pad 140 of the lower redistribution wiring layer 100, and the second lower pad pattern 244 may serve as a redistribution pad that electrically connects the second semiconductor chip 400 and the lower redistribution wiring layer 100.

For example, the second upper pad pattern 242 and the second lower pad pattern 244 may have the trapezoidal shape when viewed in cross section. The trapezoidal shape of the second upper pad pattern 242 may narrow toward the second lower pad pattern 244. The trapezoidal shape of the second lower pad pattern 244 may widen toward the second redistribution pad 140.

The second upper pad pattern 242 may have the first width D1 in the horizontal direction parallel to the first surface 102. The second lower pad pattern 244 may have the second width D2 in the horizontal direction parallel to the first surface 102 greater than the first width D1. Since the second width D2 of the second lower pad pattern 244 is greater than the first width D1 of the second upper pad pattern 242, the second lower pad pattern 244 may compensate an electrical signal of the second upper pad pattern 242.

For example, the first width D1 of the second upper pad pattern 242 may be within a range of 0.1 ㎛ to 50 ㎛. The second width D2 of the second lower pad pattern 244 may be within a range of 1.1 ㎛ to 50 ㎛.

The first and second connection pad structures 230 and 240 may include a metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof, but is not limited thereto.

In example embodiments, the first semiconductor chip 300 may be arranged on the connection layer 200. The first semiconductor chip 300 may be arranged on the first chip mounting region CA1. The first semiconductor chip 300 may be arranged such that an active surface (e.g., lower surface) on which the first chip pads 310 are formed faces the connection layer 200. The first semiconductor chip 300 may have a first size S1. Size may refer to, for example, a surface area in a plan view (e.g., a surface area of an upper surface).

The first chip pads 310 may be exposed from a lower surface of the first semiconductor chip 300. The first semiconductor chip 300 may be electrically connected to the first connection pad structures 230 of the connection layer 200 through the first chip pads 310 as conductive connection members. The first chip pads 310 may contact the first upper pad patterns 232 of the first connection pad structures 230, respectively. The first semiconductor chip 300 may be electrically connected to the first redistribution pads 130 of the lower redistribution wiring layer 100 through the first connection pad structure 230 of the connection layer 200.

The first semiconductor chip 300 may include a first chip insulating layer 320 that is provided on the lower surface of the first semiconductor chip 300. The first chip insulating layer 320 of the first semiconductor chip 300 and the first semiconductor layer 210 may be directly bonded to each other. The first semiconductor chip 300 and the first semiconductor layer 210 may be bonded to each other by oxide bonding. For example, the oxide bonding may include silica-silica bonding ($SiO_2$—$SiO_2$ Bonding) and carbon silicon nitride-carbon silicon nitride bonding (SiCN—SiCN Bonding), but is not limited thereto.

Between the first semiconductor chip 300 and the connection layer 200, the first chip pad 310 and the first connection pad structure 230 may be bonded to each other by pad to pad direct bonding (e.g., copper-copper hybrid bonding).

In example embodiments, a plurality of second semiconductor chips 400 may be arranged adjacent to and extend around (e.g., around) the first semiconductor chip 300. The second semiconductor chip 400 may be arranged on the connection layer 200 to be spaced apart from the first semiconductor chip 300. The second semiconductor chip 400 may be mounted on the second chip mounting region CA2. The second semiconductor chip 400 may be mounted such that an active surface (e.g., lower surface) faces the connection layer 200.

The second semiconductor chip 400 may have a second size S2 smaller than the first size S1 of the first semiconductor chip 300. Size may refer to, for example, a surface area in a plan view (e.g., a surface area of an upper surface). An outer surface of the second semiconductor chip 400 may be spaced apart from an outer surface of the first semiconductor chip 300 by a first distance L1 in the horizontal direction parallel to the first surface 102. For example, the first distance L1 may be within a range of 50 ㎛ to 200 ㎛. A ratio S2/S1 of a second size S2 of the second semiconductor chip 400 to a first size S1 of the first semiconductor chip 300 may be within a range of 0.01 to 0.9.

The second semiconductor chip 400 may include a substrate (e.g., a silicon substrate) and an activation layer provided on the substrate. The activation layer may have circuit patterns. The circuit patterns may be provided on one surface of the substrate. The circuit pattern may include active elements or passive elements. The circuit pattern may include, for example, transistors, diodes, resistors, capacitors, inductors, and the like. The circuit pattern may be formed by a wafer process called a front-end-of-line (FEOL) process.

The second semiconductor chip 400 may include a plurality of through electrodes 410 penetrating the substrate, a protective layer 420 on (e.g., covering) an upper surface of the substrate, a plurality of second chip pads 430 provided on the protective layer 420, and a second chip insulating layer 440 provided on a lower surface of the substrate.

The through electrode 410 may expose one end from a lower surface of the second semiconductor chip 400 (e.g., the lower surface of the substrate of the second semiconductor chip 400). The second semiconductor chip 400 may be electrically connected to the second connection pad structures 240 of the connection layer 200 through the through electrode 410 as the conductive connection members. The ends of the through electrode 410 may contact the second upper pad patterns 242 of the second connection pad structures 240, respectively. The second semiconductor chip 400 may be electrically connected to the second redistribution pad 140 of the lower redistribution wiring layer 100 through the second connection pad structure 240 of the connection layer 200.

The other end of the through electrode 410 may contact the second chip pad 430. The through electrode 410 may be electrically connected to the upper redistribution wiring layer 600 through the second chip pad 430. The second chip pad 430 may be electrically connected to a second bonding pad 640 of the upper redistribution wiring layer 600. The through electrode 410 may electrically connect the upper redistribution wiring layer 600 and the lower redistribution wiring layer 100 in the second semiconductor chip 400. The second chip pad 430 may include a first pad pattern 432 penetrating the protective layer 420, and a second pad pattern 434 provided on the first pad pattern 432 and contacting the upper redistribution wiring layer 600.

The through electrode 410 (e.g., at least one of the through electrodes 140) may have a third width D3 in the horizontal direction parallel to the first surface 102. For example, the third width D3 may be within a range of 10 ㎛ to 50 ㎛. In some embodiments, the through electrode 410 may have a round shape, and the third width D3 may be the widest width of the through electrode 410 in the horizontal direction. When the through electrode 410 has a circular shape, the third width D3 may be a diameter of the through electrode 410.

The protective layer 420 may be provided on the upper surface of the substrate of the second semiconductor chip 400. The protective layer 420 may protect the second semiconductor chip 400 from an outside element. The protective layer 420 may include an oxide film or a nitride film, or may include a double layer of an oxide film and a nitride film, but the embodiments of the protective layer 420 are not limited thereto. The protective layer 420 may include an oxide film, for example, a silicon oxide film ($SiO_2$) that is formed by a high-density plasma chemical vapor deposition (HDP-CVD) process, but is not limited thereto.

The second semiconductor chip 400 may include a second chip insulating layer 440 that is provided on the lower surface of the second semiconductor chip 400. The second chip insulating layer 440 of the second semiconductor chip 400 and the first semiconductor layer 210 may be directly bonded to each other. The second semiconductor chip 400 and the first semiconductor layer 210 may be bonded to each other by the oxide bonding, but is not limited thereto.

Between the second semiconductor chip 400 and the connection layer 200, the one end of the through electrode 410 and the second connection pad structure 240 may be bonded to each other by Cu—Cu hybrid bonding (pad to pad direct bonding), but is not limited thereto.

In example embodiments, the molding member 500 may be on (e.g., cover) at least a portion of the first and second semiconductor chips 300 and 400 on the connection layer 200. The molding member 500 may be provided on the connection layer 200 to fill a space between the lower redistribution wiring layer 100 and the upper redistribution wiring layer 600.

The upper redistribution wiring layer 600 may be arranged on an upper surface of the molding member 500. The molding member 500 may have a parallel upper surface on which the upper redistribution wiring layer 600 may be arranged. The molding member 500 may expose an upper surface of the first semiconductor chip 300 from the upper surface of the molding member 500. The molding member 500 may expose the second chip pads 430 of the second semiconductor chip 400 from the upper surface of the molding member 500.

For example, the molding member 500 may include, for example, an epoxy molding compound (EMC), but is not limited thereto. The molding member 500 may include UV resin, polyurethane resin, silicone resin, or silica filler, but is not limited thereto.

In example embodiments, the upper redistribution wiring layer (second redistribution wiring layer) 600 may have a third surface 602 and a fourth surface 604 opposite to each other. The upper redistribution wiring layer 600 may include a plurality of third redistribution pads 630 that are exposed from (e.g., at least partially exposed from) the third surface 602, and a plurality of second bonding pads 640 that are exposed from (e.g., at least partially exposed from) the fourth surface 604. The upper redistribution wiring layer 600 may be arranged on the upper surface of the molding member 500.

The upper redistribution wiring layer 600 may be electrically connected to the lower redistribution wiring layer 100 through the through electrode 410 of the second semiconductor chip 400 that is electrically connected to the second bonding pad 640. The through electrode 410 may penetrate the second semiconductor chip 400 and electrically connect the upper redistribution wiring layer 600 and the lower redistribution wiring layer 100.

The second surface 104 of the lower redistribution wiring layer 100 may have a second distance L2 from the third surface 602 of the upper redistribution wiring layer 600 in a vertical direction perpendicular to the first surface 102. For example, the second distance L2 may be within a range of 50 μm to 200 μm.

In example embodiments, the upper redistribution wiring layer 600 may include a plurality of upper insulating layers 610. The plurality of upper insulating layers 610 may include a fourth insulating layer 610*a*, a fifth insulating layer 610*b*, and/or a sixth insulating layer 610*c*, and upper redistribution wires 620 that are provided in the plurality of upper insulating layers 610. The third redistribution pad 630 and the second bonding pad 640 may be electrically connected through the upper redistribution wires 620.

Particularly, the plurality of third redistribution pads 630 may be provided in the sixth insulating layer (e.g., uppermost insulating layer) 610*c*. An upper surface of the third redistribution pad 630 may be exposed from an upper surface of the sixth insulating layer 610*c*, that may be, the third surface 602. The sixth insulating layer 610*c* may have a sixth opening that exposes the upper surface of the third redistribution pad 630.

A plurality of second bonding pads 640 may be provided in the fourth insulating layer 610*a*. A lower surface of each of the second bonding pads 640 may be exposed from a lower surface of the fourth insulating layer 610*a*, that may be, the fourth surface 604. The fourth insulating layer 610*a* may have a fourth opening that exposes at least a portion of an upper surface of each of the second bonding pads 640. The second bonding pads 640 may be provided on the second chip mounting region CA2 of the upper redistribution wiring layer 600. The second bonding pads 640 may contact and electrically connect to the second chip pads 430 of the second semiconductor chip 400.

The upper redistribution wire 620 may be provided on the fourth insulating layer 610*a*, and may contact the second bonding pads 640 through the fourth opening. The fifth insulating layer 610*b* may be provided on the fourth insulating layer 610*a*, and may have a fifth opening that exposes at least a portion of the upper redistribution wire 620.

The third redistribution pad 630 may be provided on the fifth insulating layer 610*b*, and may contact the upper redistribution wire 620 through the fifth opening. The sixth insulating layer 610*c* may be provided on the fifth insulating layer 610*b*, and may have the sixth opening that exposes at least a portion of the third redistribution pad 630. Accordingly, the upper surface of the plurality of third redistribution pads 630 may be exposed from the upper surface of the sixth insulating layer 610*c*, that may be, the third surface 602 of the upper redistribution wiring layer 600.

In example embodiments, the third semiconductor chip 700 may be arranged on the upper redistribution wiring layer 600. The third semiconductor chip 700 may be mounted on the upper redistribution wiring layer 600 by a flip chip bonding method. In this case, the third semiconductor chip 700 may be mounted on the upper redistribution wiring layer 600 such that an active surface on which third chip pads 710 are formed to face the upper redistribution wiring layer 600. The third chip pads 710 may be disposed on the second chip pads 430.

The third chip pads 710 of the third semiconductor chip 700 may be electrically connected to the third redistribution pads 630 of the upper redistribution wiring layer 600 through conductive bumps 720 as conductive connection members. For example, the conductive bumps 720 may include micro bumps (uBumps).

For example, the third semiconductor chip 700 may include a semiconductor device such as a memory device. The third semiconductor chip 700 may include a volatile memory device such as an SRAM device and a DRAM device, and/or a nonvolatile memory device such as flash memory devices, PRAM devices, MRAM devices, and RRAM devices, but is not limited thereto.

An adhesive member 730 may be provided between the third semiconductor chip 700 and the upper redistribution wiring layer 600. For example, the adhesive member 730 may include an epoxy material.

As described above, the upper and lower redistribution wiring layers 600 and 100 may be electrically connected to each other through the through electrodes 410 of the second semiconductor chip 400. The first and second semiconductor chips 300 and 400 may be electrically connected to each other through the first redistribution wiring layer 100. Since the second semiconductor chip 400 has the through electrode 410, the semiconductor package 10 may utilize a keep out zone (KOZ) by providing the through electrodes 410 of the second semiconductor chip 400 in the KOZ. The second semiconductor chip 400 may include a memory semiconductor or a logic semiconductor. Restrictions on design and limited space of the semiconductor package 10 may be solved through the through electrodes 410 of the second semiconductor chip 400.

Additionally, the first and second semiconductor chips 300 and 400 may be spaced apart from each other on the first redistribution wiring layer 100, and the molding member 500 may be filled between the first and second semiconductor chips 300 and 400. The molding member 500 may prevent thermal coupling between the first and second semiconductor chips 300 and 400. The connection layer 200 may support the semiconductor package 10 from inside of the semiconductor package 10, and may reduce (e.g., prevent) warpage of the semiconductor package 10.

Hereinafter, a method of manufacturing the semiconductor package in FIG. 1 will be described.

FIGS. 5 to 25 are views illustrating a method of manufacturing a semiconductor package in accordance with example embodiments.

Referring to FIGS. 5 to 9, a semiconductor (e.g., silicon) wafer W having a first semiconductor layer 210 that has first and second upper pad patterns 232 and 242 may be formed on a first carrier substrate C1.

Figure 5:
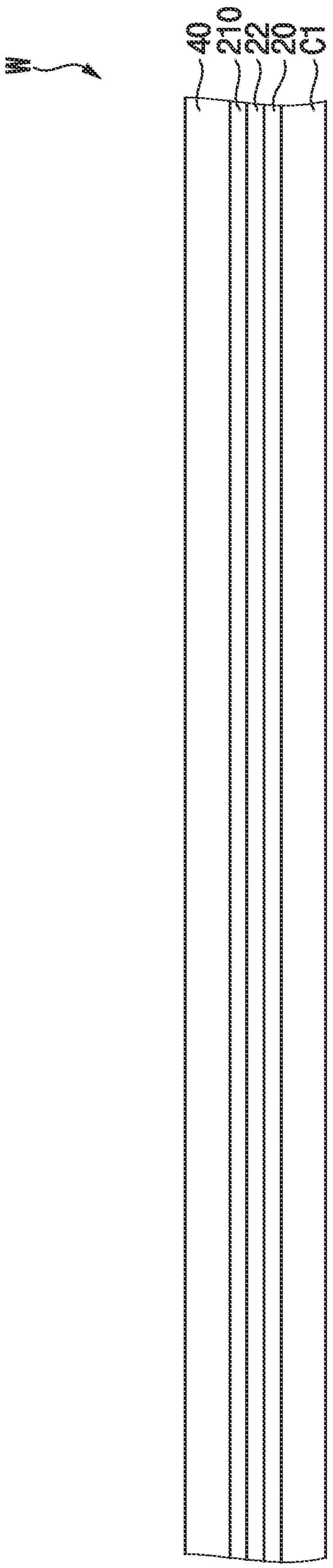

As illustrated in FIG. 5, a release tape 20, a barrier metal layer 22, the first semiconductor layer 210, and a first photoresist layer 40 may be sequentially formed on the carrier substrate C1.

Figure 6:
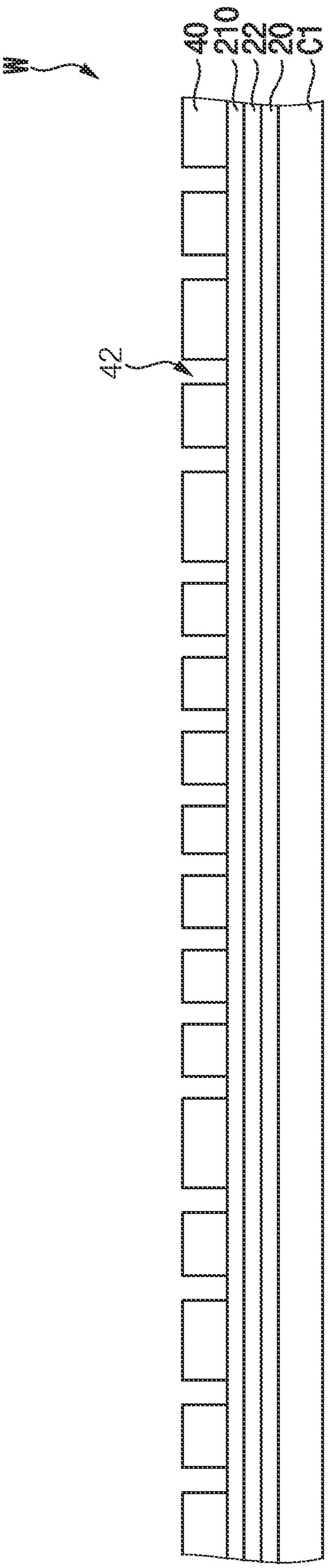

As illustrated in FIG. 6, an exposure process may be performed on the first photoresist layer 40 to form a first photoresist pattern 42 having first temporary openings that expose regions of the first and second upper pad patterns 232 and 242.

Figure 7:
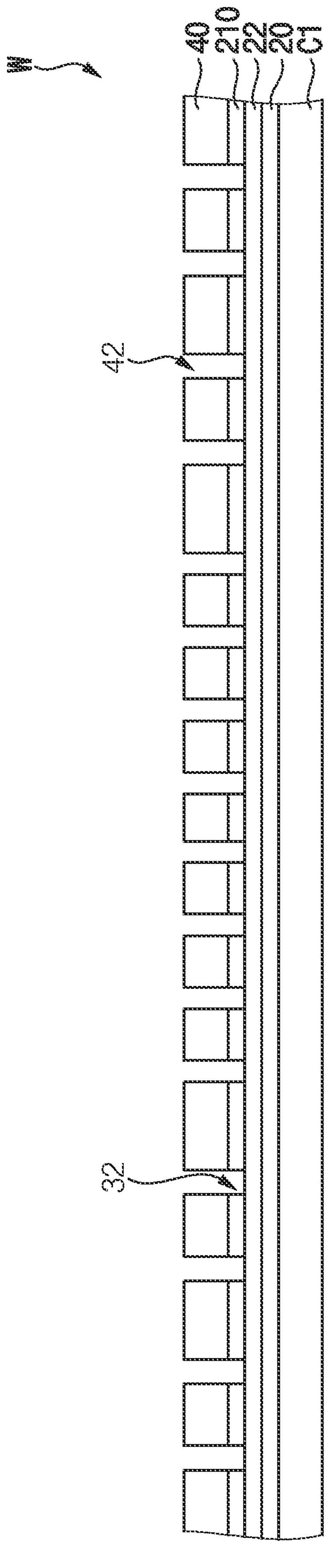

As illustrated in FIG. 7, an etching process may be performed on the first photoresist pattern 42 to form first through openings 32. The first through openings 32 may be formed in the first semiconductor layer 210 through the etching process.

A portion of the first semiconductor layer 210 may be selectively removed to form the first through openings 32. For example, the etching process may include a wet etching process, a dry etching process, a plasma etching process, and the like.

The wet etching process may be performed through an etchant that has an etching selectivity with respect to the first semiconductor layer 210. For example, the etchant may include water ($H_20$), hydrogen peroxide ($H_20_2$), citric acid ($C_6H_8O_7$), and the like.

For example, the dry etching process may include a physical etching process, a chemical etching process, and a physical chemical etching process. The plasma etching process may be performed using, for example, inductive coupled plasma, capacitive coupled plasma, microwave plasma, or the like.

Figure 8:
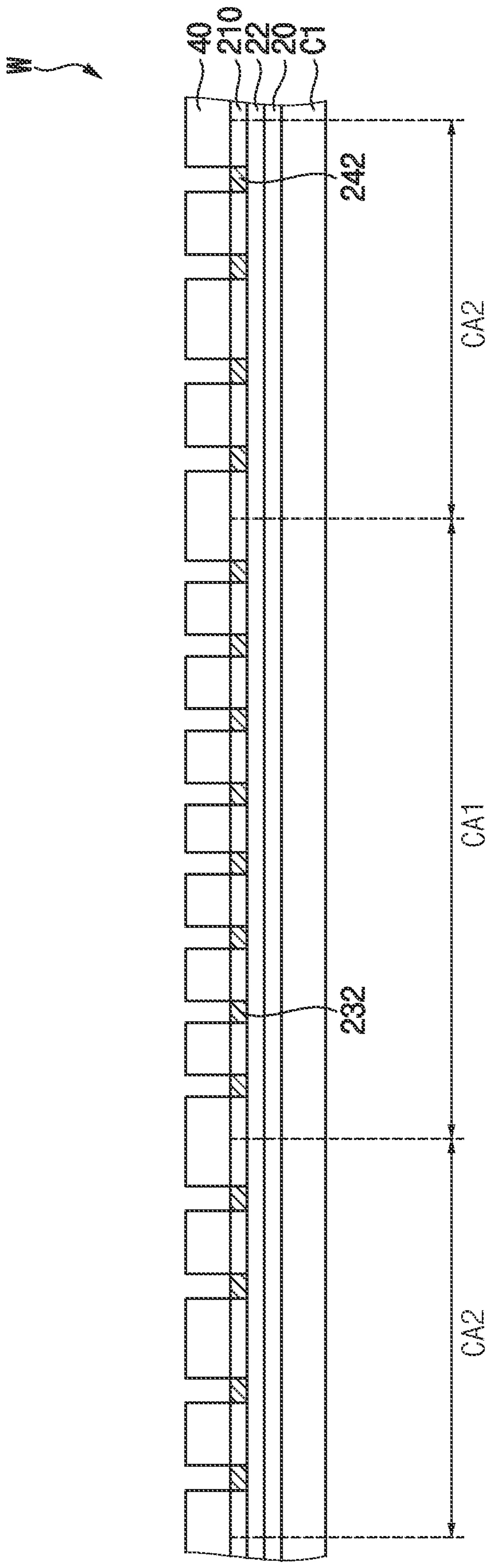
Figure 9:
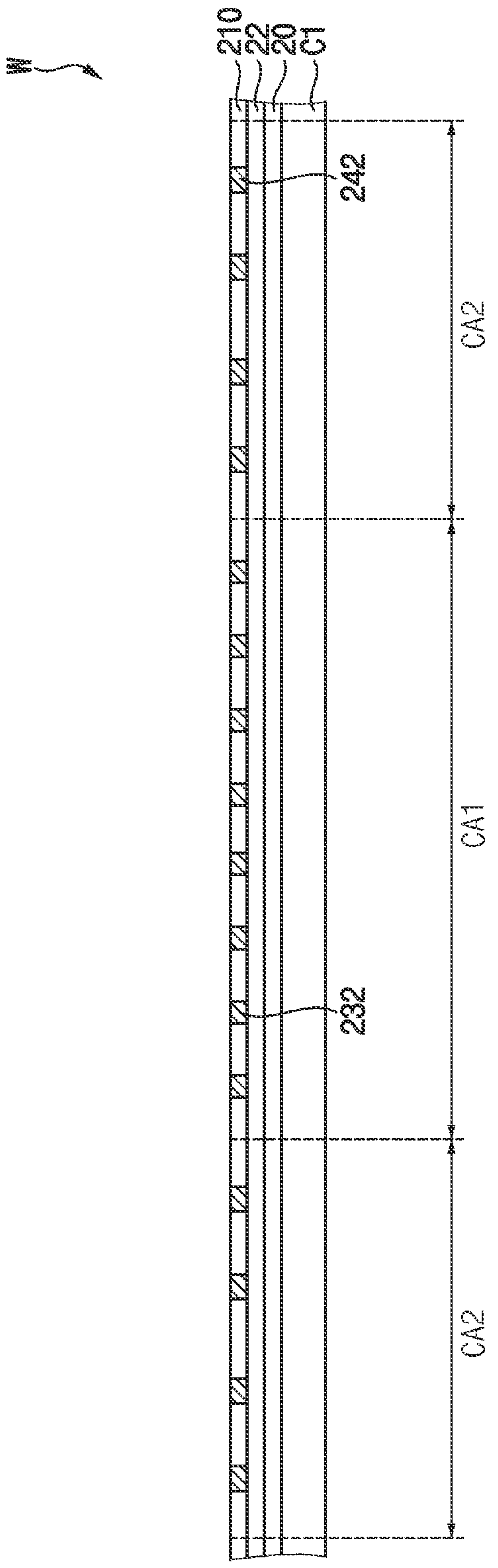

As illustrated in FIGS. 8 and 9, the first and second upper pad patterns 232 and 242 may be formed in the first through openings 32 of the first semiconductor layer 210.

First, a seed layer may be formed on the first through openings 32. The seed layer may form the first and second upper pad patterns 232 and 242 in the first through openings 32. For example, the seed layer may include titanium (Ti), titanium nitrogen compound (TiN), titanium oxygen compound ($TiO_2$), chromium nitrogen compound (CrN), titanium carbon nitrogen compound (TiCN), titanium aluminum nitrogen compound (TiAlN), or alloys thereof. The seed layer may be formed by a sputtering process, but the formation of the see layer is not limited thereto.

The first and second upper pad patterns 232 and 242 may be formed on the first through openings 32 that vertically penetrate the first semiconductor layer 210. A conductive material may be introduced into the first through openings 32 to form the first and second upper pad patterns 232 and 242. The conductive material may be hardened in the first through openings 32 to form the first and second upper pad patterns 232 and 242. The first upper pad patterns 232 may be formed on a first chip mounting region CA1. The second upper pad patterns 242 may be formed on a second chip mounting a region rea CA2.

A first plating process may be performed on the first through openings 32 to form the first and second upper pad patterns 232 and 242. For example, the first and second upper pad patterns 232 and 242 may be formed by a plating process, an electroless plating process, a vapor deposition process, or the like. For example, the first and second upper pad patterns 232 and 242 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn), but is not limited thereto.

Then, the first photoresist layer 40 may be removed to form the first and second upper pad patterns 232 and 242 that vertically penetrate the first semiconductor layer 210. Each of the first and second upper pad patterns 232 and 242 may have the first width D1 in the horizontal direction parallel to the first surface 102, which will be formed by later processes. For example, the first width D1 may be within a range of 0.1 μm to 50 μm.

Figure 10:
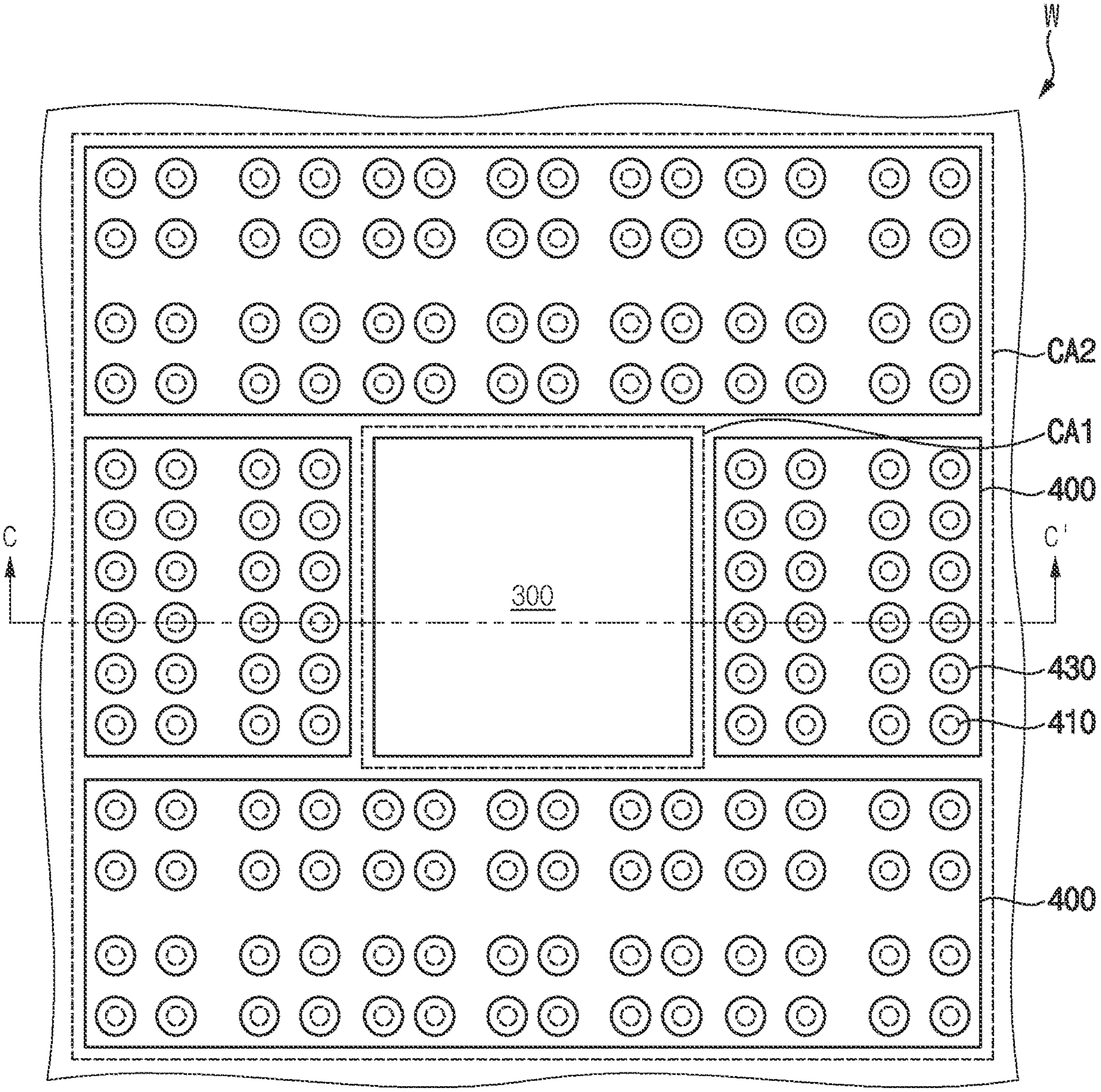
Figure 11:
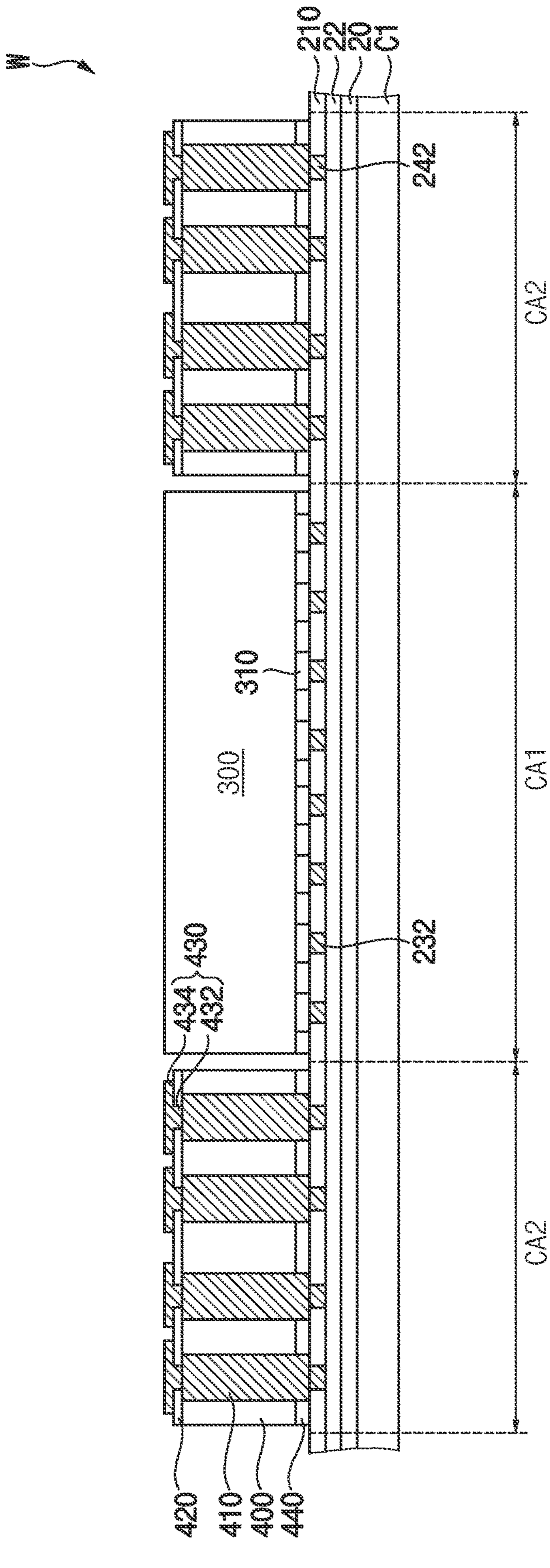
Figure 12:
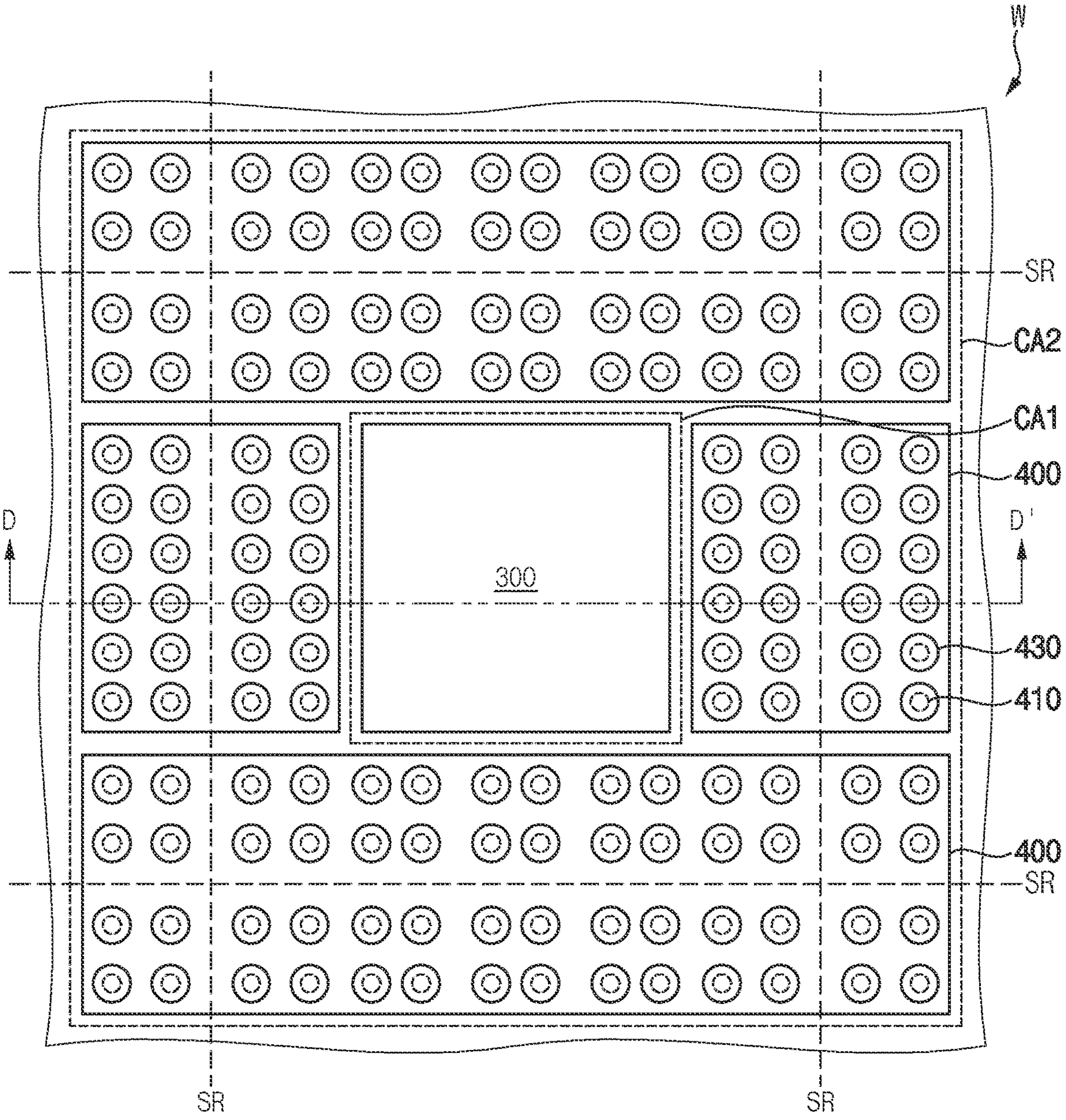
Figure 13:
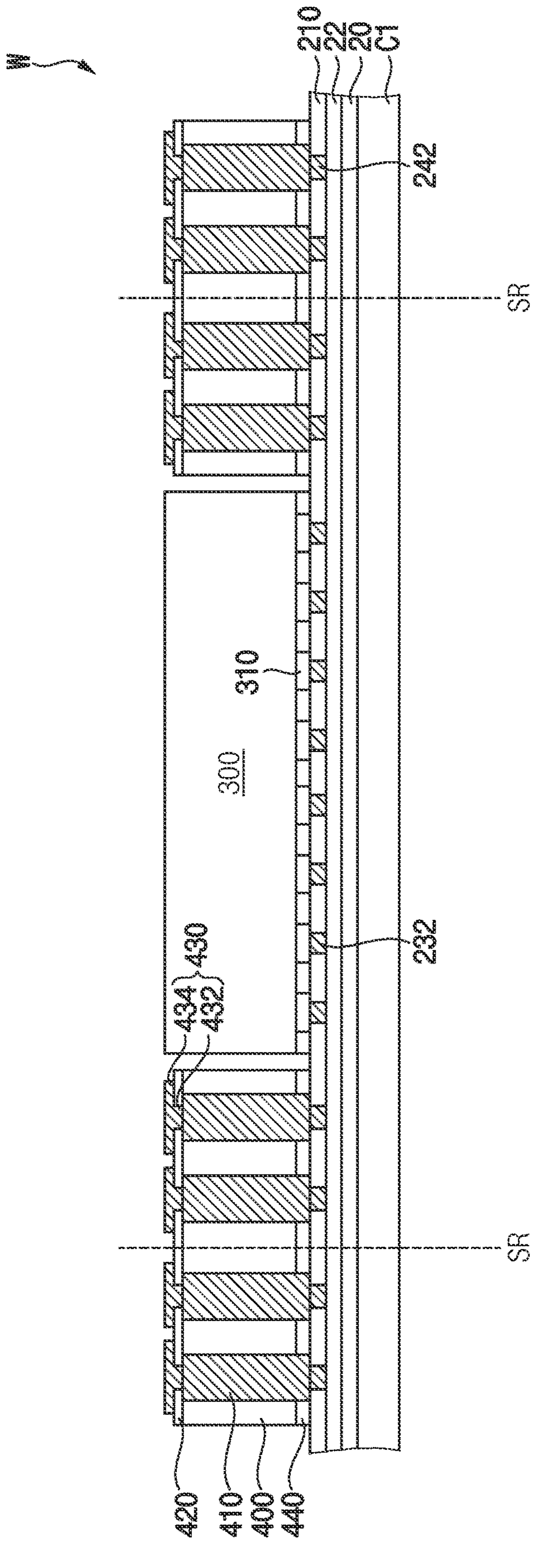

FIGS. 10 and 12 are plan views illustrating a first semiconductor layer 210 on which first and second semiconductor chips 300 and 400 are mounted. FIG. 11 is a cross-sectional view taken along the line C-C' in FIG. 10. FIG. 13 is a cross-sectional view taken along the line D-D' in FIG. 12.

Referring to FIGS. 10 and 11, first and second semiconductor chips 300 and 400 may be mounted on the first semiconductor layer 210. The first semiconductor chip 300 may be mounted on the first chip mounting region CA1. The second semiconductor chip 400 may be mounted on the second chip mounting region CA2.

In example embodiments, the first semiconductor chip 300 may be bonded to the first semiconductor layer 210. The first semiconductor chip 300 may include a first chip insulating layer 320 that is provided on a lower surface of the first semiconductor chip 300. The first chip insulating layer 320 provided on the lower surface of the first semiconductor chip 300 and the first semiconductor layer 210 may be directly bonded to each other. For example, the first semiconductor chip 300 and the first semiconductor layer 210 may be bonded to each other by oxide bonding. For example, the oxide bonding may include silica-silica bonding ($SiO_2$—$SiO_2$ Bonding) and carbon silicon nitride-carbon silicon nitride bonding (SiCN—SiCN Bonding).

The first semiconductor chip 300 may be electrically connected to the first upper pad patterns 232 of the first semiconductor layer 210 through first chip pads 310 in the first chip insulating layer 320 as conductive connection members. The first chip pads 310 may be bonded to the first upper pad patterns 232, respectively. Between the first semiconductor chip 300 and the first semiconductor layer 210, the first chip pad 310 and the first upper pad pattern 232 may be bonded to each other by Cu—Cu hybrid bonding (pad to pad direct bonding), but are not limited there to.

In example embodiments, the second semiconductor chip 400 may be bonded to the first semiconductor layer 210. The second semiconductor chip 400 may include a second chip insulating layer 440 provided on a lower surface of the second semiconductor chip 400. The second chip insulating layer 440 provided on the lower surface of the second semiconductor chip 400 and the first semiconductor layer 210 may be directly bonded to each other. The second semiconductor chip 400 and a second semiconductor layer 220 may be bonded to each other by oxide bonding, but is not limited thereto.

The second semiconductor chip 400 may be electrically connected to the second upper pad patterns 242 of the first semiconductor layer 210 by through electrodes 410 as conductive connection members. In some embodiments the through electrodes 410 may be electrically connected to the second connection pad structures 240. The through electrode 410 may have one end exposed from an upper surface of the second semiconductor chip 400, and the through electrode may expose the other end from the lower surface of the second semiconductor chip 400. The other end of the through electrodes 410 may be bonded to the second upper pad patterns 242, respectively. Between the second semiconductor chip 400 and the first semiconductor layer 210, the through electrode 410 and the second upper pad pattern 242 may be bonded to each other by Cu—Cu hybrid bonding (pad to pad direct bonding), but is not limited thereto.

Referring to FIGS. 12 and 13, the second semiconductor chip 400 may be arranged on a scribe lane region SR from which the semiconductor wafer W, which will be described later, is cut. The scribe lane region SR may be referred to a portion that is cut by a sawing process at a wafer level. The scribe lane SR may be adjacent to and extend around (e.g., surround) the first chip mounting region CA1. The scribe lane SR may overlap with the second chip mounting region CA2.

The second semiconductor chip 400 may have a substrate (e.g., a silicon substrate) and an activation layer provided on the substrate. The activation layer may have circuit patterns. The circuit patterns may be provided on one surface of the substrate. The circuit pattern may include active elements or passive elements. The circuit pattern may include transistors, diodes, resistors, capacitors, inductors, and the like, but is not limited thereto. The circuit pattern may be formed by a wafer process called a front-end-of-line (FEOL) process.

The circuit pattern and the through electrode 410 of the second semiconductor chip 400 may not provide on the scribe lane region SR. Accordingly, in the second semiconductor chip 400, only portions of the substrate where the circuit pattern and the through electrode 410 are not disposed may be cut in the scribe lane region SR by the sawing process.

Figure 14:
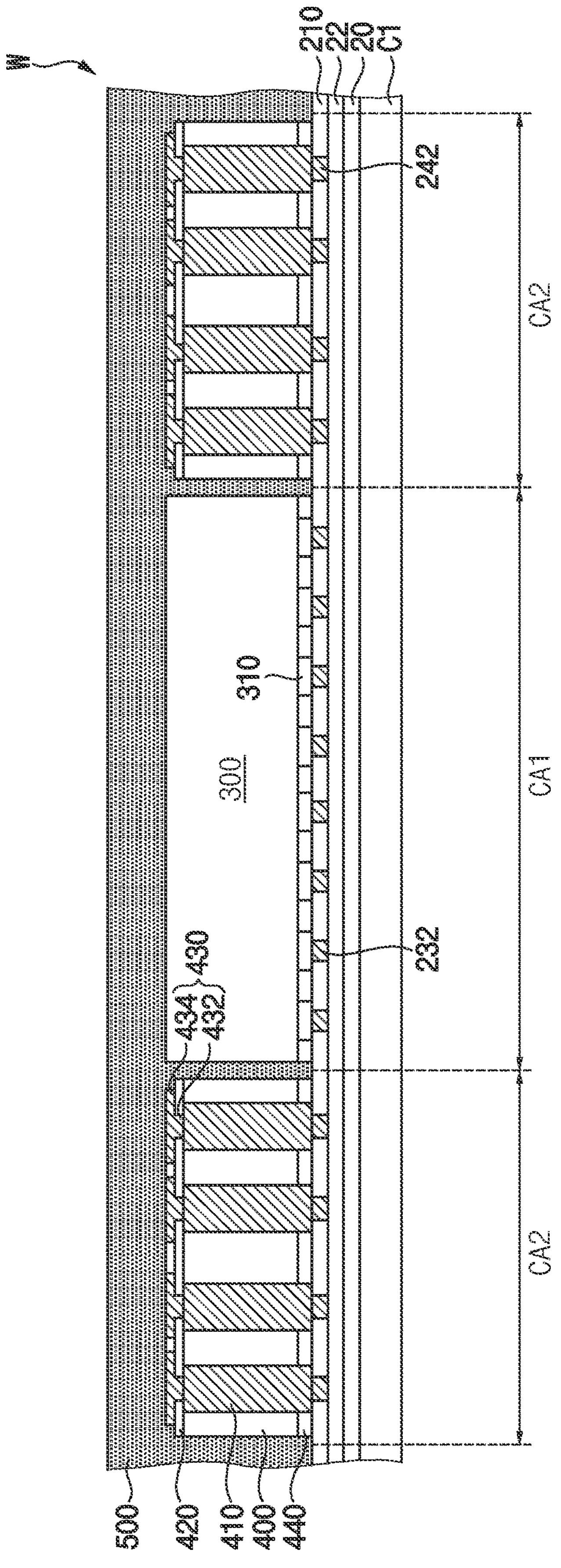
Figure 15:
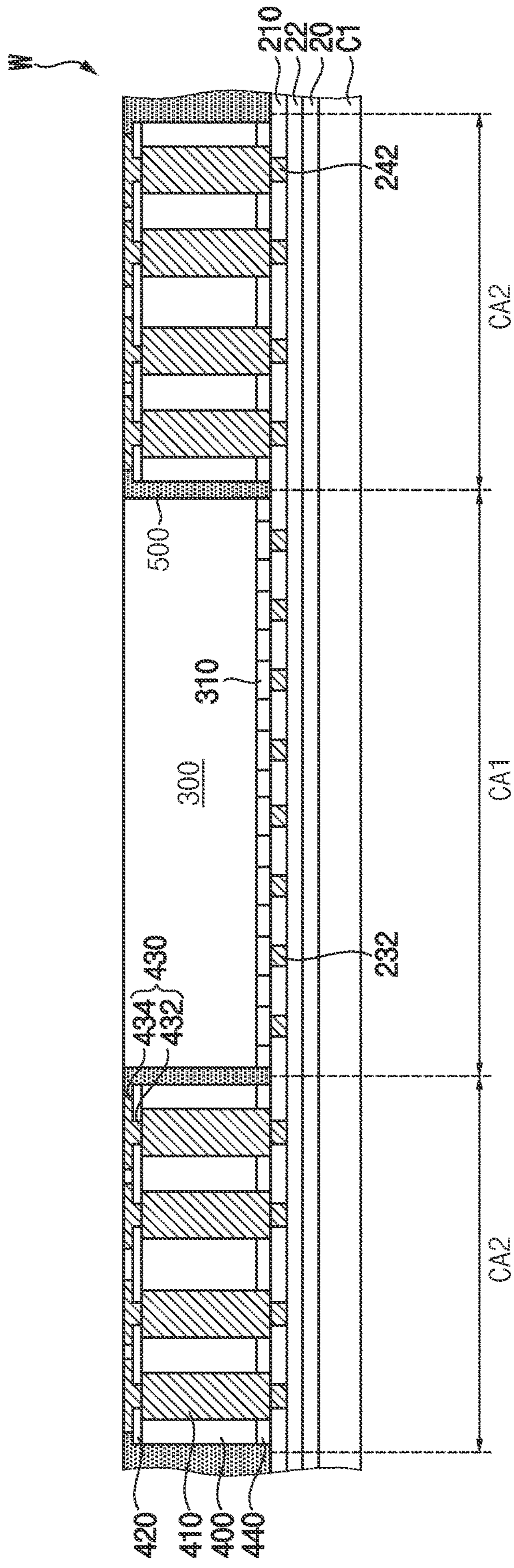

Referring to FIGS. 14 and 15, the molding member 500 may be formed on the first and second semiconductor chips 300 and 400 on the first semiconductor layer 210. The molding member may cover a portion of the first and second semiconductor chips 300 and 400.

As illustrated in FIG. 14, since the first and second semiconductor chips 300 and 400 are bonded to the first semiconductor layer 210, a chip alignment change of the first and second semiconductor chips 300 and 400 may be prevented even when the molding member 500 is introduced.

For example, the molding member 500 may include an epoxy molding compound (EMC). The molding member 500 may include UV resin, polyurethane resin, silicone resin, or silica filler, but is not limited thereto.

As illustrated in FIG. 15, an upper surface of the molding member 500 may be partially removed by a grinding process such as a chemical mechanical polishing (CMP) process. Accordingly, a vertical thickness of the molding member 500 may be reduced to a desired thickness. An upper surface of the first semiconductor chip 300 may be exposed from the upper surface of the molding member 500. The second semiconductor chip 400 may expose a portion of second chip pads 430 from the upper surface of the molding member 500.

Figure 16:
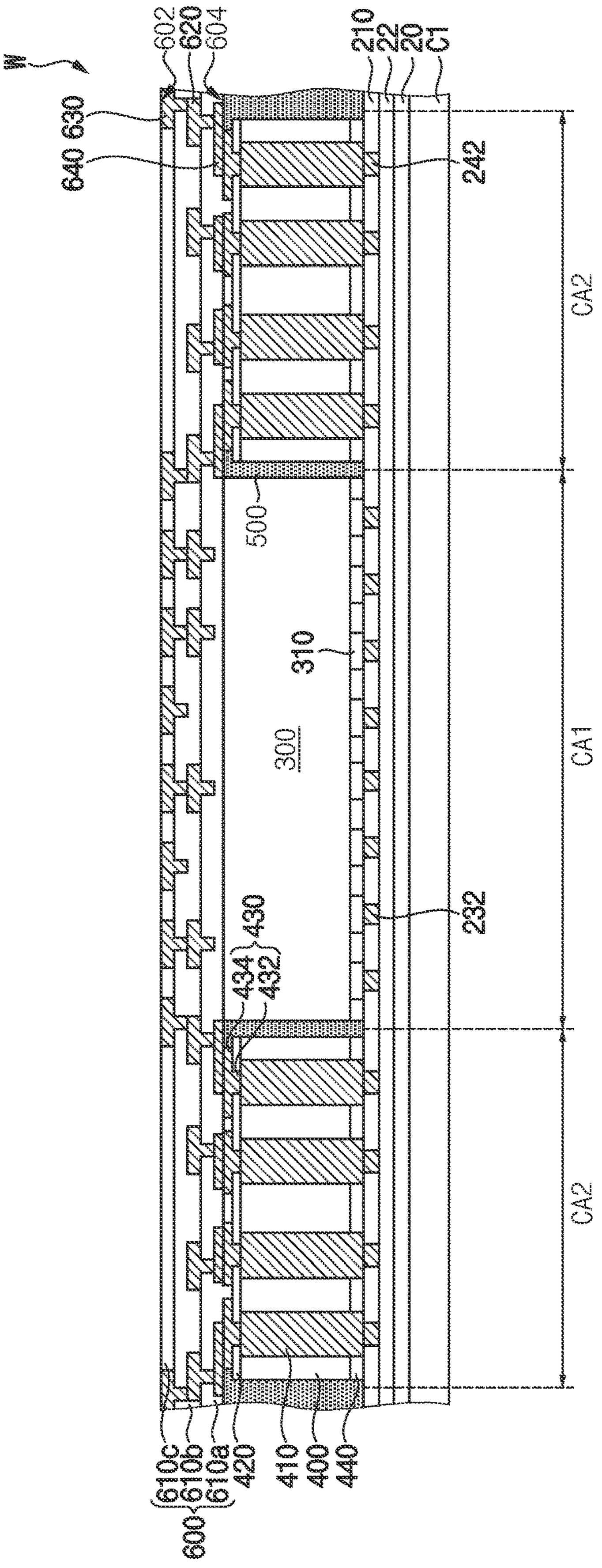

Referring to FIG. 16, an upper redistribution wiring layer 600 may be formed on the molding member 500. The upper redistribution wiring layer 600 may be formed such that the second chip pads 430 of the second semiconductor chip 400 are electrically connected to second bonding pads 640 in the upper redistribution wiring layer 600.

First, a fourth insulating layer 610*a* may be formed on the molding member 500 to cover the second chip pads 430 of the second semiconductor chip 400, the fourth insulating layer 610*a* may be patterned to form fourth openings that expose a portion of the second chip pads 430.

For example, the fourth insulating layer 610*a* may include a polymer or a dielectric layer. Particularly, the fourth insulating layer 610*a* may include polyimide (PI), lead oxide (PbO), polyhydroxystyrene (PHS), or NOVOLAC, but is not limited thereto. The fourth insulating layer 610*a* may be formed by a vapor deposition process, a spin coating process, or the like, but is not limited thereto.

An upper redistribution wire 620 may be formed on the fourth insulating layer 610*a* to be electrically connected to each of the second chip pads 430 through the fourth openings. A seed layer may be formed on a portion of the fourth insulating layer 610*a* and in the fourth opening, and the seed layer may be patterned and an electroplating process may be performed to form the upper redistribution wires 620. In some embodiments, the upper redistribution wire 620 may directly contact each of the second chip pads 430 through the fourth openings.

For example, the upper redistribution wire 620 may include aluminum (Al), copper (Cu), tin (Sn), nickel (Ni), gold (Au), platinum (Pt), or alloys thereof.

Then, a fifth insulating layer 610*b* may be formed on the fourth insulating layer 610*a* to cover a portion of the upper redistribution wires 620, the fifth insulating layer 610*b* may be patterned to form a fifth openings that expose a portion of the upper redistribution wires 620. Third redistribution pads 630 may be formed on the fifth insulating layer 610*b* to directly contact the upper redistribution wires 620 through the fifth openings.

Then, a sixth insulating layer 610*c* may be formed on the fifth insulating layer 610*b* to cover a portion of the third redistribution pads 630, and the sixth insulating layer 610*c* may be patterned to form a sixth opening that exposes a portion of the third redistribution pad 630.

Figure 21:
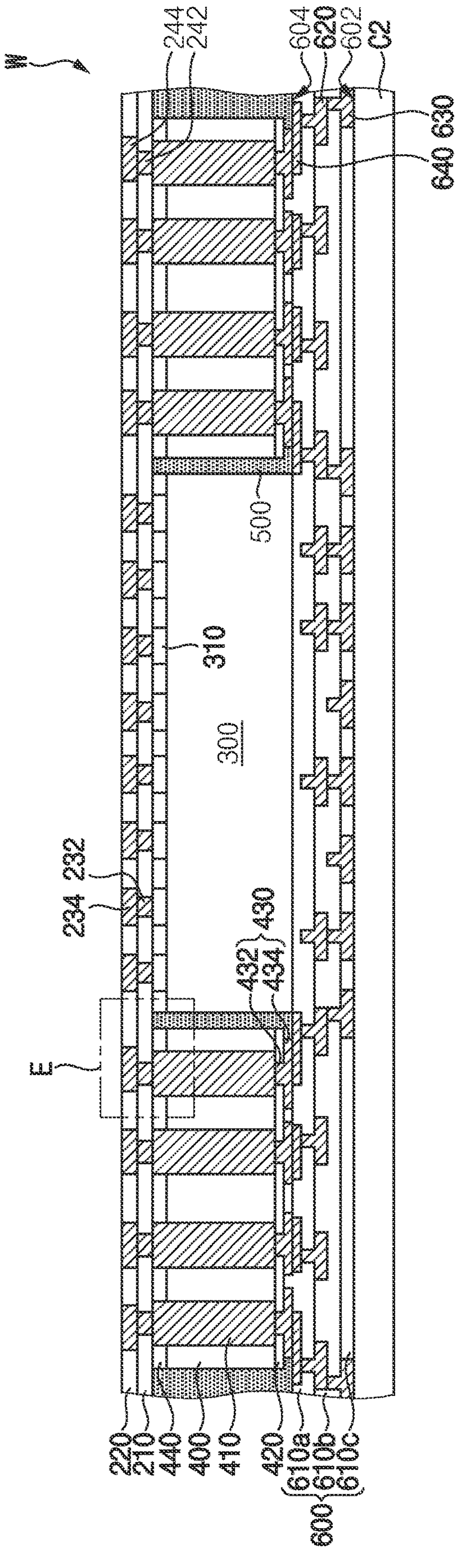
Figure 22:
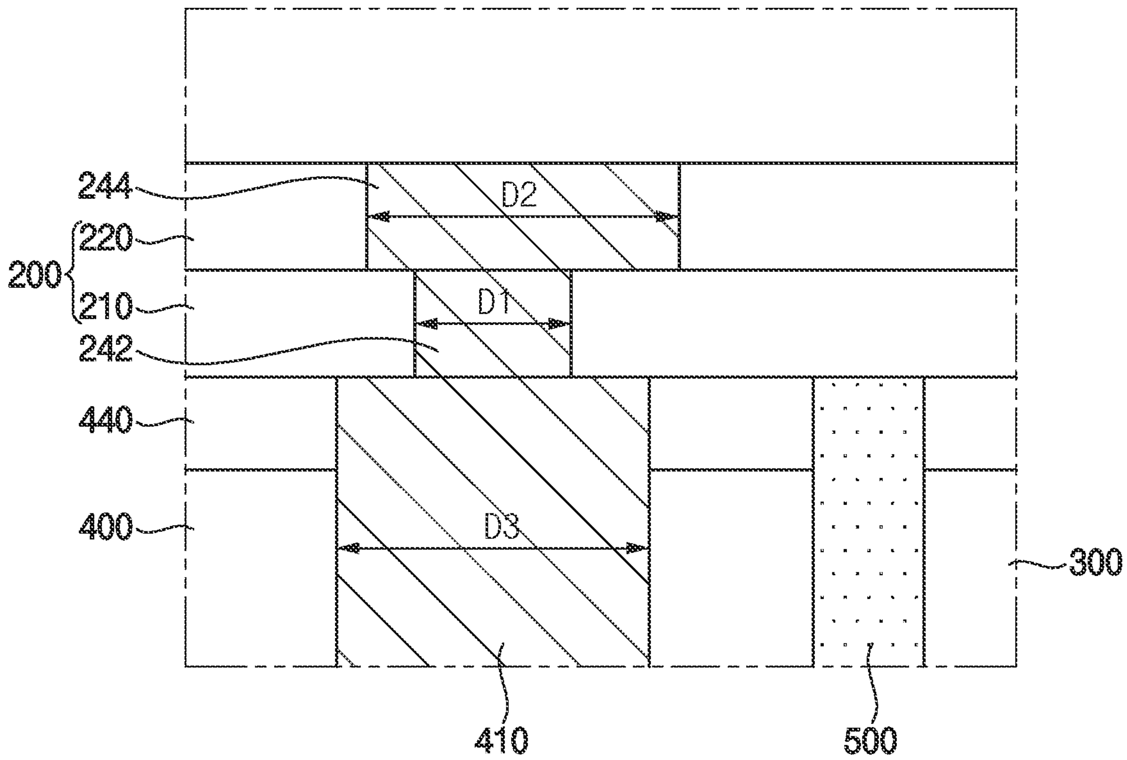

FIG. 22 is an enlarged cross-sectional view illustrating portion ‘E’ in FIG. 21.

Referring to FIGS. 17 to 22, the second semiconductor layer 220 may be formed on the first semiconductor layer 210 to form a connection layer 200 that has first and second connection pad structures 230 and 240.

Figure 17:
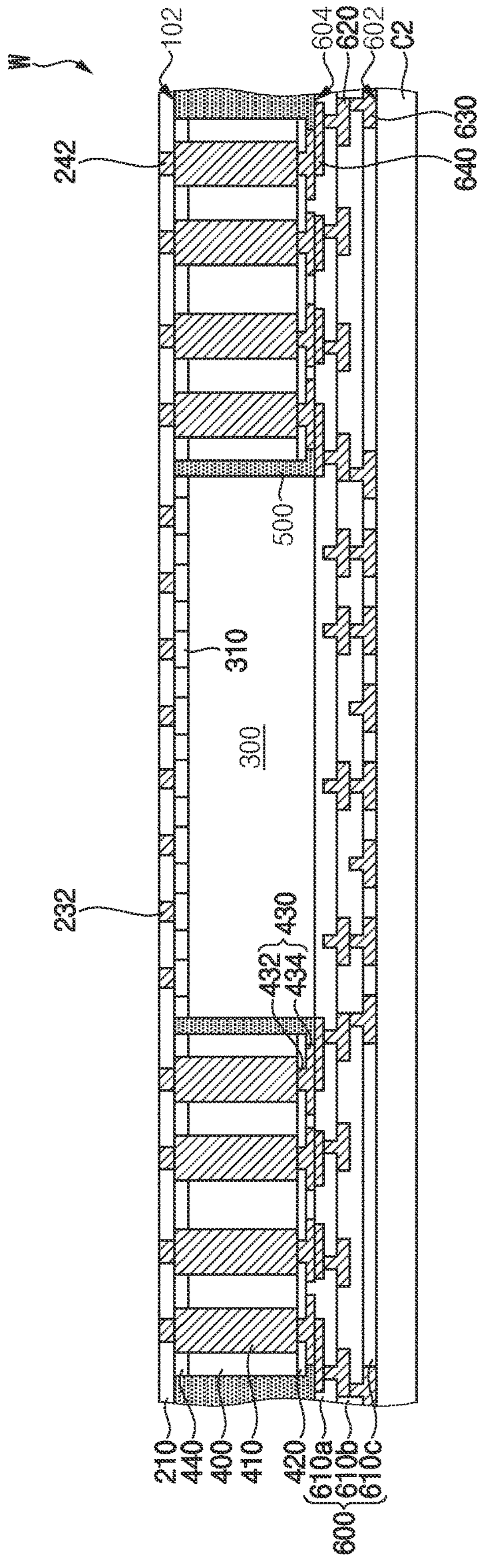

As illustrated in FIG. 17, a second carrier substrate C2 may be attached on the upper redistribution wiring layer 600, a structure to which the second carrier substrate C2 is attached may be turned over, and the first carrier substrate C1 on a lower surface of the first semiconductor layer 210 may be removed. In this case, the first and second upper pad patterns 232 and 242 may be exposed from the lower surface of the first semiconductor layer 210.

Figure 18:
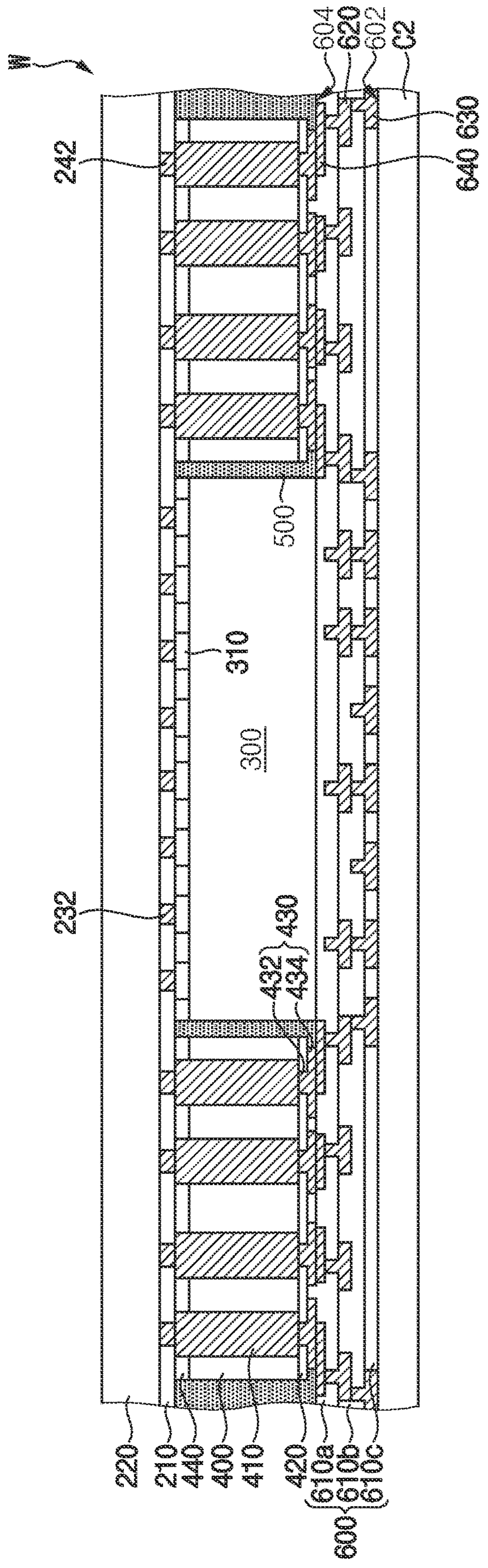
Figure 19:
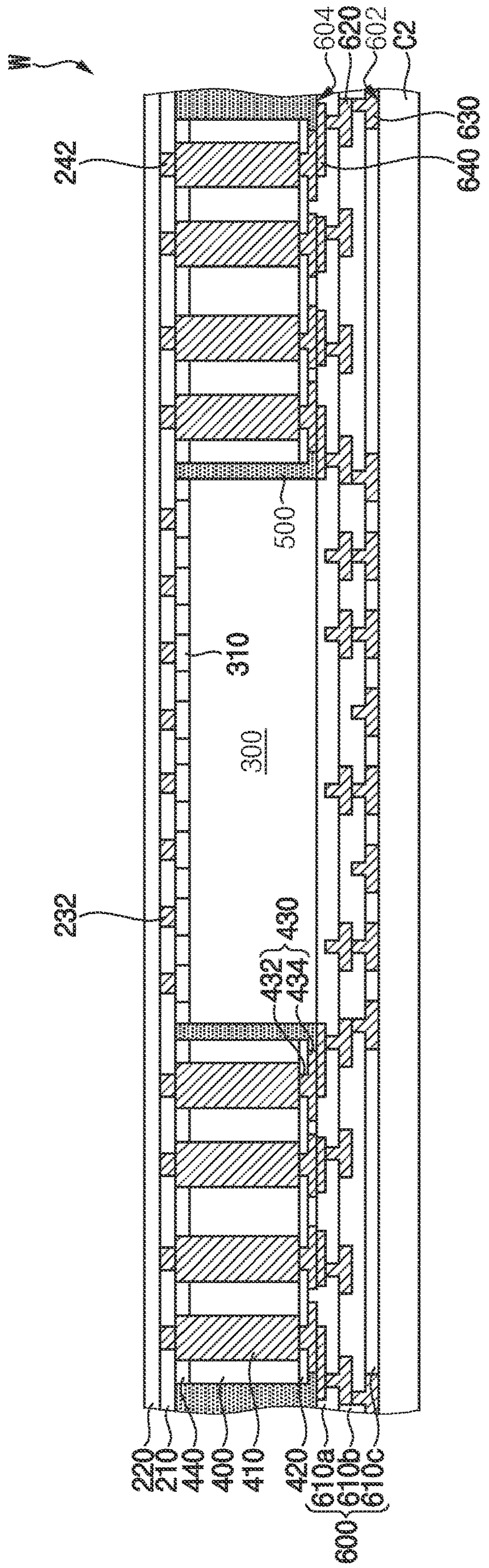

As illustrated in FIGS. 18 and 19, the second semiconductor layer 220 may be formed on the first semiconductor layer 210. The first semiconductor layer 210 and the second semiconductor layer 220 may be directly bonded to each other. The first semiconductor layer 210 and the second semiconductor layer 220 may be bonded to each other by oxide bonding, but is not limited thereto. The first semiconductor layer 210 and the second semiconductor layer 220 may be bonded to each other to form the connection layer 200.

A surface of the second semiconductor layer 220 may be partially removed by a grinding process such as a chemical mechanical polishing (CMP) process. Accordingly, a thickness of the second semiconductor layer 220 may be reduced to a desired thickness.

Figure 20:
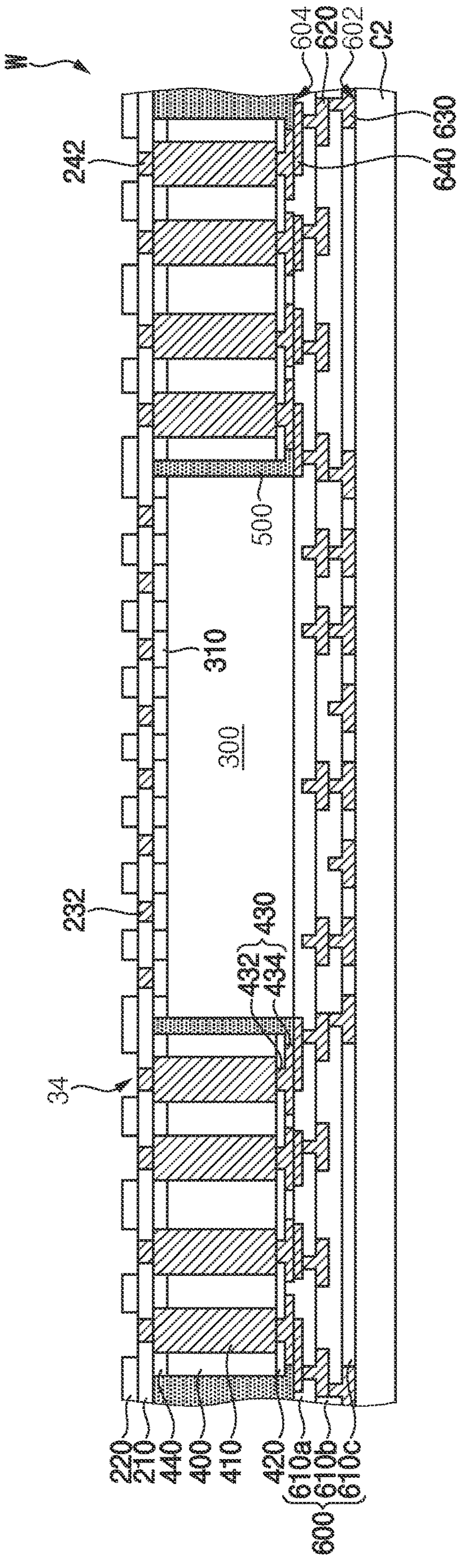

As illustrated in FIGS. 20 to 22, processes the same as or similar to the processes described with reference to FIGS. 5 to 9 may be performed on the second semiconductor layer 220 to form first and second lower pad patterns 234 and 244. The first upper pad pattern 232 and the first lower pad pattern 234 may form a first connection pad structure 230. The second upper pad pattern 242 and the second lower pad pattern 244 may form a second connection pad structure 240.

First, an exposure process may be performed on a second photoresist layer to form a second photoresist pattern having second temporary openings that expose regions of the first and second lower pad patterns 234 and 244.

Then, an etching process may be performed on the second photoresist pattern to form second through openings 34. The second through openings 34 may be formed in the second semiconductor layer 220 by the etching process.

Portions of the first semiconductor layer 210 may be selectively removed to form the second through openings 34. For example, the etching process may include a wet etching process, a dry etching process, a plasma etching process, and the like.

Then, the first and second lower pad patterns 234 and 244 may be formed in the second through openings 34 of the second semiconductor layer 220.

First, a seed layer may be formed on the second through openings 34. The seed layer may form the first and second lower pad patterns 234 and 244 in the second through openings 34. For example, the seed layer may include titanium (Ti), titanium nitrogen compound (TiN), titanium oxygen compound (TiO2), chromium nitrogen compound (CrN), titanium carbon nitrogen compound (TiCN), titanium aluminum nitrogen compound (TiAlN) or alloys thereof. The seed layer may be formed by a sputtering process, but is not limited thereto.

The first and second lower pad patterns 234 and 244 may be formed in the second through openings 34 that vertically penetrates the second semiconductor layer 220. The conductive material may be introduced into the second through openings 34 to form the first and second lower pad patterns 234 and 244. The conductive material may be hardened in the second through openings 34 to form first and second lower pad patterns 234 and 244. The first lower pad patterns 234 may be formed on the first upper pad pattern 232. The second lower pad patterns 244 may be formed on the second upper pad pattern 242.

A second plating process may be performed on the second through openings 34 to form the first and second lower pad patterns 234 and 244. For example, the first and second lower pad patterns 234 and 244 may be formed by a plating process, an electroless plating process, a vapor deposition process, or the like. For example, the first and second lower pad patterns 234 and 244 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn), but is not limited thereto.

Then, the second photoresist layer may be removed to form the first and second lower pad patterns 234 and 244 that vertically penetrate the second semiconductor layer 220. Each of the first and second lower pad patterns 234 and 244 may have a second width D2 in the horizontal direction parallel to the first surface 102, which will be formed by later processes. The second width D2 is greater than the first width D1. For example, the second width D2 may be within a range of 0.1 μm to 50 μm.

Figure 23:
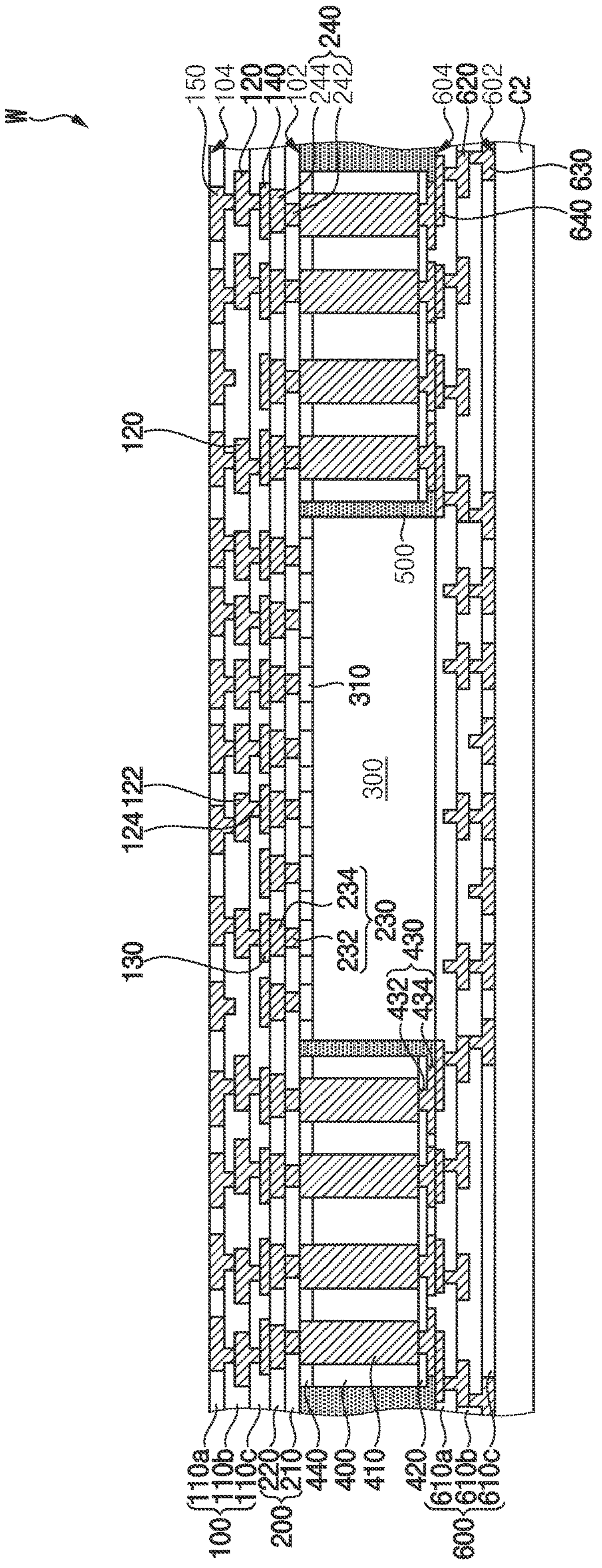

Referring to FIG. 23, processes the same as or similar to the processes described with reference to FIGS. 5 to 9 may be performed on the second semiconductor layer 220 to form a lower redistribution wiring layer 100.

First, a third insulating layer 110*c* may be formed on the second semiconductor layer 220 to cover a portion of the first and second connection pad structures 230 and 240. The third insulating layer 110*c* may be patterned to form third openings that expose a portion of the first and second connection pad structures 230 and 240.

First and second redistribution pads 130 and 140 may be formed on the third insulating layer 110*c* to contact the first and second connection pad structures 230 and 240 through the third openings. After a seed layer is formed on a portion of the third insulating layer 110*c* and in the third opening, the seed layer may be patterned and an electroplating process may be performed to form the first and second redistribution pads 130 and 140. Accordingly, at least some of the first and second redistribution pads 130 and 140 may directly contact the first and second connection pad structures 230 and 240 through the third opening. The first redistribution pad 130 may contact the first connection pad structure 230, and the second redistribution pad 140 may contact the second connection pad structure 240.

Then, the second insulating layer 110*b* may be formed on the third insulating layer 110*c* to cover a portion of the first and second redistribution pads 130 and 140, and the second insulating layer 110*b* may be patterned to form second openings that expose a portion of the first and second redistribution pads 130 and 140, respectively. First bonding pads 150 may be formed on the second insulating layer 110*b* to directly contact the first and second redistribution pads 130 and 140 through the second openings.

Then, a first insulating layer 110*a* may be formed on the second insulating layer 110*b* to cover a portion of the first bonding pads 150, and the first insulating layer 110*a* may be patterned to form first openings that expose a portion of the first bonding pads 150.

Figure 24:
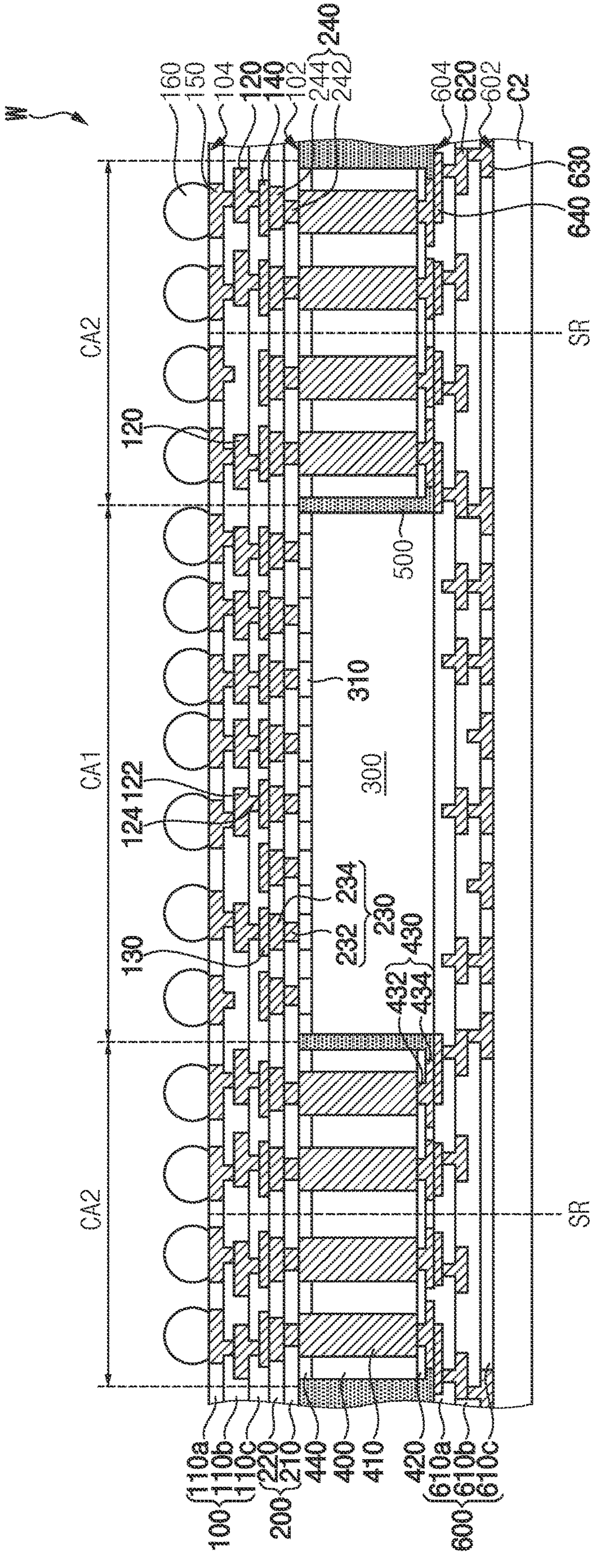
Figure 25:
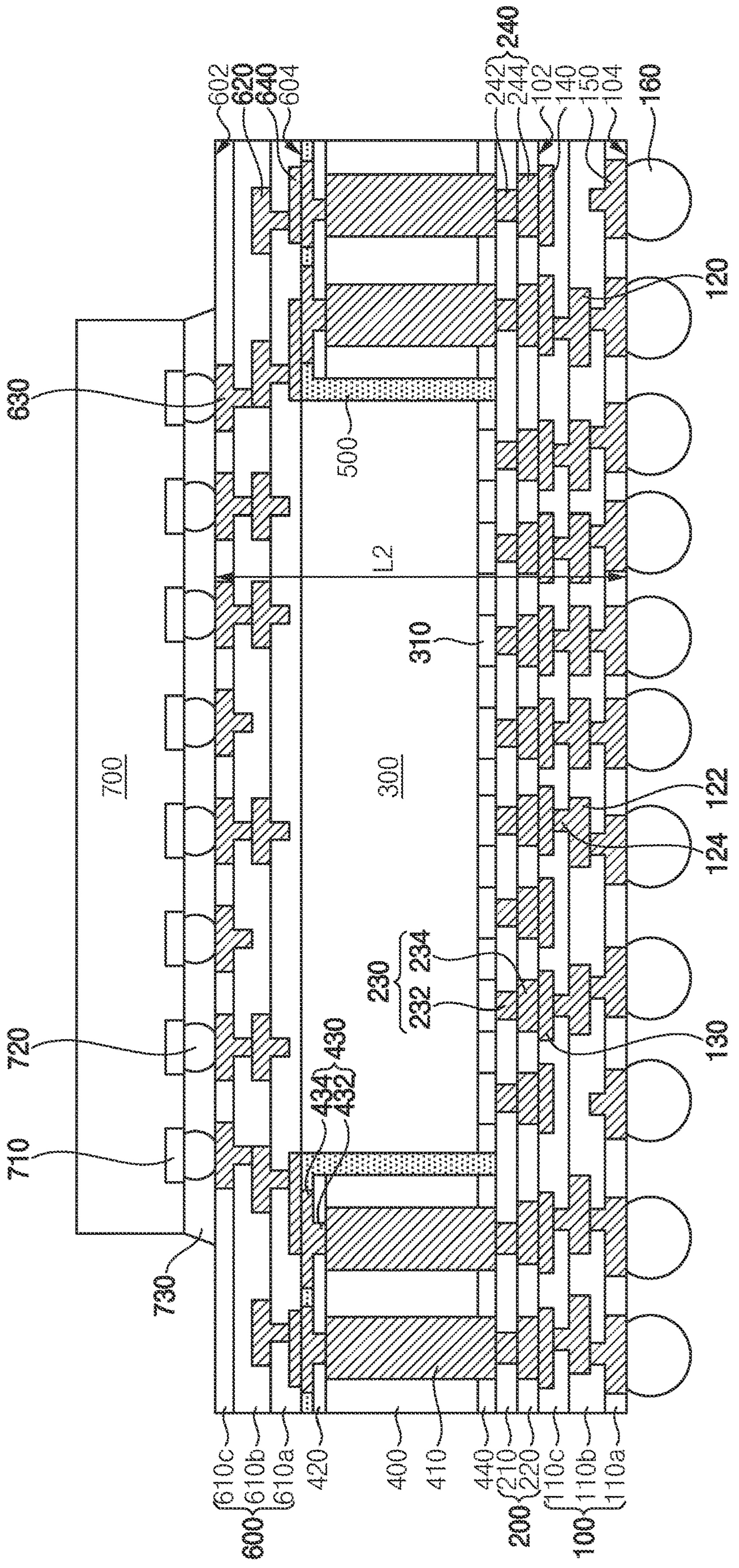

Referring to FIGS. 24 and 25, external connection bumps 160 may be formed on the first bonding pads 150 of the lower redistribution wiring layer 100, respectively, and the semiconductor wafer W may be cut to complete the semiconductor package 10.

As illustrated in FIG. 24, the external connection bumps 160 may be formed on the first bonding pads 150, respectively. Particularly, a third temporary opening of a third photoresist pattern may be filled up with the conductive material, the third photoresist pattern may be removed and a reflow process may be performed to form the external connection bumps 160. For example, the conductive material may be formed by a plating process. Alternatively, the external connection bumps 160 may be formed by a screen printing method, a deposition method, or the like, but is not limited thereto. For example, the external connection bumps 160 may include C4 bumps.

As illustrated in FIG. 25, a third semiconductor chip 700 may be mounted on the upper redistribution wiring layer 600.

After the third semiconductor chip 700 is mounted on the upper redistribution wiring layer 600, an underfilling adhesive member 730 may be formed between the upper redistribution wiring layer 600 and the third semiconductor chip 700.

In example embodiments, the third semiconductor chip 700 may be mounted on the upper redistribution wiring layer 600 by a flip chip bonding method, but is not limited thereto. Third chip pads 710 of the third semiconductor chip 700 may be electrically connected to the second bonding pads 640 of the upper redistribution wiring layer 600 through conductive bumps 720. For example, the conductive bumps 720 may include micro bumps (uBumps), but is not limited thereto.

Then, the adhesive member 730 may be injected between the upper redistribution wiring layer 600 and the third semiconductor chip 700. For example, the adhesive member 730 may include an epoxy material to reinforce a gap between the upper redistribution wiring layer 600 and the third semiconductor chip 700.

Then, the semiconductor wafer W may be cut along the scribe lane SR to complete the semiconductor package 10 in FIG. 1. The semiconductor wafer W may be cut by a dicing process, but is not limited thereto.

As described above, the upper and lower redistribution wiring layers 600 and 100 may be electrically connected to each other through the through electrodes 410 of the second semiconductor chip 400. Since the second semiconductor chip 400 has the through electrode 410, the semiconductor package 10 may utilize a keep out zone (KOZ) by providing the through electrodes 410 of the second semiconductor chip 400 in the KOZ. The second semiconductor chip 400 may include a memory semiconductor or a logic semiconductor. Restrictions on design and limited space of the semiconductor package 10 may be solved through the through electrodes 410 of the second semiconductor chip 400.

Also, the first and second semiconductor chips 300 and 400 may be spaced apart from each other on the first redistribution wiring layer 100, and the molding member 500 may be filled between the first and second semiconductor chips 300 and 400. The molding member 500 may prevent thermal coupling between the first and second semiconductor chips 300 and 400. The connection layer 200 may support the semiconductor package 10 from the inside of the semiconductor package 10, and may prevent warpage of the semiconductor package 10.

The connection layer 200 provided on the lower redistribution wiring layer 100 may strongly fix the first and second semiconductor chips 300 and 400 during a process of covering the first and second semiconductor chips 300 and 400 with the molding member 500 on the lower redistribution wiring layer 100. Since oxide bonding is formed between the first and second semiconductor chips 300 and 400 and the connection layer 200, the first and second semiconductor chips 300 and 400 may be strongly fixed to the connection layer 200. The connection layer 200 may prevent a chip alignment change of the first and second semiconductor chips 300 and 400 during the process.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

It should also be noted that in some alternate implementations, the steps of the method of manufacturing or the steps of operations herein may occur out of the order. For example, two steps described in succession may in fact be executed substantially concurrently or the steps may sometimes be executed in the reverse order. Moreover, the steps of method or operation may be separated into multiple steps and/or may be at least partially integrated. Finally, other steps may be added/inserted between the steps that are illustrated, and/or the steps may be omitted without departing from the scope of the present invention.

The terminology used herein is for the purpose of describing particular embodiments only and is not intended to be limiting of the disclosure. As used herein, the singular forms “a,” “an,” and “the” are intended to include the plural forms as well, unless the context clearly indicates otherwise. It will be further understood that the terms “comprises,” “comprising,” “includes,” and/or “including,” when used in this specification, specify the presence of the stated features, steps, operations, elements, and/or components, but do not preclude the presence or addition of one or more other features, steps, operations, elements, components, and/or groups thereof.

It will be understood that when an element is referred to as being “coupled,” “connected,” or “responsive” to, or “on,” another element, it can be directly coupled, connected, or responsive to, or on, the other element, or intervening elements may also be present. In contrast, when an element is referred to as being “directly coupled,” “directly connected,” or “directly responsive” to, or “directly on,” another element, there are no intervening elements present. In addition, “electrical connection” conceptually includes a physical connection and a physical disconnection. As used herein, the term “and/or” includes any and all combinations of one or more of the associated listed items. Moreover, the symbol “/” will be understood to be equivalent to the term “and/or.”

It will be understood that when an element is “on” a surface, the surface may face the element.

It will be understood that although the terms “first,” “second,” etc. may be used herein to describe various elements, these elements should not be limited by these terms. These terms are only used to distinguish one element from another. Thus, a first element could be termed a second element without departing from the teachings of the present embodiments.

Spatially relative terms, such as “beneath,” “below,” “lower,” “above,” “upper,” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as “below” or “beneath” other elements or features would then be oriented “above” the other elements or features. Thus, the term “below” can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and sub combinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents and shall not be restricted or limited by the foregoing detailed description.

What is claimed is:

1. A semiconductor package, comprising:

a first redistribution wiring layer including first and second surfaces opposite to each other, wherein the first redistribution wiring layer includes a first chip mounting region and a second chip mounting region adjacent to the first chip mounting region, and wherein the first redistribution wiring layer includes a plurality of redistribution pads that are exposed from the first surface;

a connection layer on the first surface of the first redistribution wiring layer, wherein the connection layer includes first connection pad structures and second connection pad structures, wherein the first connection pad structures contact at least one of the plurality of redistribution pads on the first chip mounting region, and wherein the second connection pad structures contact at least one of the plurality of redistribution pads on the second chip mounting region;

a first semiconductor chip on the first chip mounting region on the connection layer, wherein the first semiconductor chip includes first chip pads that are electrically connected to the first connection pad structures;

a second semiconductor chip spaced apart from the first semiconductor chip on the second chip mounting region on the connection layer, wherein the second semiconductor chip includes through electrodes that are electrically connected to the second connection pad structures;

a molding member on the first and second semiconductor chips on the connection layer; and a second redistribution wiring layer on the molding member, wherein the second redistribution wiring layer is electrically connected to the first redistribution wiring layer through the through electrodes, wherein the second semiconductor chip includes an activation layer, wherein the activation layer has circuit patterns, and wherein the second semiconductor chip is on the connection layer such that the activation layer faces the connection layer.

2. The semiconductor package of claim 1, wherein each of the second connection pad structures includes an upper pad pattern that contacts at least one of the through electrodes and a lower pad pattern that is on the upper pad pattern and contacts at least one of the plurality of redistribution pads.

3. The semiconductor package of claim 2, wherein the upper pad pattern has a first width in a horizontal direction parallel to the first surface, and the lower pad pattern has a second width in the horizontal direction greater than the first width.

4. The semiconductor package of claim 3, wherein the first width of the upper pad pattern is within a range of 0.1 micrometers (μm) to 50 μm, wherein the second width of the lower pad pattern is within a range of 1.1 μm to 50 μm, and wherein at least one of the through electrodes has a third width in the horizontal direction, and the third width is within a range of 10 μm to 50 μm.

5. The semiconductor package of claim 1, wherein a distance between the first and second semiconductor chips in a horizontal direction parallel to the first surface is within a range of 50 micrometers (μm) to 200 μm.

6. The semiconductor package of claim 1, wherein an upper surface of the first semiconductor chip has a surface area of a first size S1, wherein an upper surface of the second semiconductor chip has a surface area of a second size S2, and wherein a ratio of the second size S2 to the first size S1 is within a range of 0.01 to 0.9.

7. The semiconductor package of claim 1, wherein a distance from the second surface of the first redistribution wiring layer to an upper surface of the second redistribution wiring layer in a vertical direction perpendicular to the first surface of the first redistribution wiring layer is within a range of 50 micrometers (μm) to 200 μm.

8. The semiconductor package of claim 1, further comprising:

a first bonding pad in the first redistribution wiring layer; and an external connection bump on the first bonding pad, wherein the first bonding pad is exposed from the second surface of the first redistribution wiring layer.

9. The semiconductor package of claim 1, further comprising:

a third semiconductor chip on the second redistribution wiring layer.

10. The semiconductor package of claim 1, further comprising:

a protective layer on an upper surface of the second semiconductor chip;

a first pad pattern penetrating the protective layer; and a second pad pattern on the first pad patterns, wherein the second pad pattern contacts the second redistribution wiring layer.

11. A semiconductor package, comprising:

a lower redistribution wiring layer that includes first and second surfaces opposite to each other, wherein the lower redistribution wiring layer includes a first chip mounting region and a second chip mounting region that is adjacent to the first chip mounting region, wherein the lower redistribution wiring layer includes a plurality of first redistribution pads that are exposed from the first surface, a plurality of second redistribution pads that are exposed from the second surface, and conductive connection members respectively provided on the plurality of second redistribution pads;

a first semiconductor chip on the second chip mounting region of the connection layer and electrically connected to the first connection pad structures;

a second semiconductor chip on the second chip mounting region of the connection layer to be spaced apart from the first semiconductor chip, wherein the second semiconductor chip includes a plurality of through electrodes that are electrically connected to the second connection pad structures;

a molding member on the first and second semiconductor chips on the connection layer; and an upper redistribution wiring layer through the plurality of through electrodes, wherein the second semiconductor chip includes an activation layer, wherein the activation layer has circuit patterns, and wherein the second semiconductor chip is on the connection layer such that the activation layer faces the connection layer.

* * * * *